(12) United States Patent
Nakamura

(10) Patent No.: US 11,424,427 B2
(45) Date of Patent: Aug. 23, 2022

(54) DISPLAY DEVICE AND MANUFACTURING METHOD OF DISPLAY DEVICE, AND ELECTRONIC DEVICE

(71) Applicant: Sony Semiconductor Solutions Corporation, Kanagawa (JP)

(72) Inventor: Kouichi Nakamura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/975,014

(22) PCT Filed: Mar. 15, 2019

(86) PCT No.: PCT/JP2019/010849
§ 371 (c)(1),
(2) Date: Aug. 21, 2020

(87) PCT Pub. No.: WO2019/188416
PCT Pub. Date: Oct. 3, 2019

(65) Prior Publication Data
US 2020/0395570 A1    Dec. 17, 2020

(30) Foreign Application Priority Data

Mar. 30, 2018 (JP) .............................. JP2018-066954

(51) Int. Cl.
*H01L 51/52* (2006.01)
*H01L 27/32* (2006.01)
*H01L 51/56* (2006.01)

(52) U.S. Cl.
CPC ...... *H01L 51/5218* (2013.01); *H01L 27/3218* (2013.01); *H01L 51/5209* (2013.01); *H01L 51/5221* (2013.01); *H01L 51/5271* (2013.01); *H01L 51/56* (2013.01)

(58) Field of Classification Search
CPC ........................ H01L 51/5209; H01L 51/5218
See application file for complete search history.

(56) References Cited

U.S. PATENT DOCUMENTS 9,224,980 B2 * 12/2015 Yamazaki ............. H01L 51/525
9,614,015 B2 * 4/2017 Park .................... H01L 51/5209
10,475,866 B2 * 11/2019 Choi ................... H01L 27/3246
10,651,253 B2 * 5/2020 Ohara ................. H01L 27/3248
10,872,943 B2 * 12/2020 Jun ..................... H01L 51/5218
(Continued)

FOREIGN PATENT DOCUMENTS

GB         2564588 A  *  1/2019 .......... H01L 27/322
JP    2005-331665 A     12/2005
(Continued)

*Primary Examiner* — Victoria K. Hall
(74) *Attorney, Agent, or Firm* — Michael Best & Friedrich LLP

(57) ABSTRACT

A display device of the present disclosure includes a pixel region including a pixel including a light emitting unit arranged on a substrate, and, in the pixel region, an anode electrode of the light emitting unit is provided with a region including a pixel inclined with respect to a substrate surface. Then, an electrode surface of the anode electrode has an inclination angle according to a surface shape of a base insulating layer. An electronic device of the present disclosure includes the display device having the configuration described above.

18 Claims, 30 Drawing Sheets

(56) References Cited

U.S. PATENT DOCUMENTS

| | | | |
|---|---|---|---|
| 11,004,920 B2* | 5/2021 | Kim | H01L 27/3246 |
| 2004/0222740 A1* | 11/2004 | Kim | H01L 51/5271 |
| | | | 313/506 |
| 2005/0285509 A1* | 12/2005 | Funamoto | H01L 51/5275 |
| | | | 313/504 |
| 2006/0006794 A1* | 1/2006 | Sakakura | H01L 51/5209 |
| | | | 313/503 |
| 2008/0143649 A1* | 6/2008 | Asaki | H01L 51/5209 |
| | | | 345/76 |
| 2010/0052518 A1* | 3/2010 | Jeon | H01L 51/5209 |
| | | | 313/504 |
| 2010/0176717 A1* | 7/2010 | Lee | H01L 51/5271 |
| | | | 313/504 |
| 2010/0327297 A1* | 12/2010 | Yoshida | H01L 27/3258 |
| | | | 257/89 |
| 2011/0297943 A1* | 12/2011 | Kim | H01L 27/3258 |
| | | | 257/59 |
| 2013/0105781 A1* | 5/2013 | Matsushima | H01L 51/5203 |
| | | | 257/40 |
| 2014/0191202 A1* | 7/2014 | Shim | H01L 27/3211 |
| | | | 257/40 |
| 2014/0291648 A1* | 10/2014 | Yamazaki | H01L 51/525 |
| | | | 257/40 |
| 2014/0306241 A1* | 10/2014 | Hirakata | H01L 27/322 |
| | | | 257/79 |
| 2014/0339514 A1* | 11/2014 | Oh | H01L 27/3258 |
| | | | 257/40 |
| 2014/0346449 A1* | 11/2014 | Choi | H01L 51/5268 |
| | | | 257/40 |
| 2015/0001477 A1* | 1/2015 | Namkung | H01L 27/3258 |
| | | | 257/40 |
| 2015/0028315 A1* | 1/2015 | Nishimura | H01L 27/326 |
| | | | 257/40 |
| 2015/0060832 A1* | 3/2015 | Ito | H01L 51/5271 |
| | | | 257/40 |
| 2015/0069353 A1* | 3/2015 | Takashige | H01L 51/0012 |
| | | | 257/40 |
| 2015/0144919 A1* | 5/2015 | Matsumoto | H01L 27/322 |
| | | | 257/40 |
| 2015/0206928 A1* | 7/2015 | Kimura | H01L 51/5271 |
| | | | 257/88 |
| 2015/0221893 A1* | 8/2015 | Teraguchi | H01L 27/3248 |
| | | | 257/40 |
| 2015/0236076 A1* | 8/2015 | Sim | H01L 27/326 |
| | | | 438/34 |
| 2016/0087017 A1* | 3/2016 | Park | H01L 51/5225 |
| | | | 257/40 |
| 2016/0155784 A1* | 6/2016 | Park | H01L 51/5225 |
| | | | 438/23 |
| 2016/0226013 A1* | 8/2016 | Liu | H01L 51/5209 |
| 2016/0254333 A1* | 9/2016 | Zhang | H01L 51/5234 |
| | | | 257/40 |
| 2016/0260789 A1* | 9/2016 | Zhang | H01L 51/0017 |
| 2016/0336385 A1* | 11/2016 | Li | H01L 27/1248 |
| 2016/0365531 A1* | 12/2016 | Hu | H01L 51/5209 |
| 2017/0141163 A1* | 5/2017 | Xiong | H01L 51/5225 |
| 2017/0155094 A1* | 6/2017 | Joung | H01L 51/5225 |
| 2017/0243932 A1* | 8/2017 | Ohara | H01L 51/5012 |
| 2017/0278913 A1* | 9/2017 | Zhang | H01L 27/3258 |
| 2017/0287997 A1* | 10/2017 | Park | H01L 27/3258 |
| 2018/0062116 A1* | 3/2018 | Park | H01L 51/5234 |
| 2018/0114816 A1* | 4/2018 | Sagawa | H01L 27/3211 |
| 2018/0158886 A1* | 6/2018 | Dong | H01L 27/3246 |
| 2018/0166648 A1* | 6/2018 | Dai | H01L 51/5209 |
| 2018/0190923 A1* | 7/2018 | Heo | H01L 51/5253 |
| 2018/0211979 A1* | 7/2018 | Lee | H01L 51/5209 |
| 2018/0212198 A1* | 7/2018 | Inoue | H05B 33/24 |
| 2018/0323404 A1* | 11/2018 | Inoue | G09F 9/30 |
| 2018/0331325 A1* | 11/2018 | Zhang | H01L 51/5209 |
| 2019/0067381 A1* | 2/2019 | Kim | H01L 51/5209 |
| 2019/0067383 A1* | 2/2019 | Jo | H01L 27/322 |
| 2019/0103442 A1* | 4/2019 | Choi | H01L 51/5225 |
| 2019/0181188 A1* | 6/2019 | Youn | H01L 51/5253 |
| 2019/0181365 A1* | 6/2019 | Choi | H01L 51/5281 |
| 2019/0189718 A1* | 6/2019 | Lee | H01L 27/3276 |
| 2019/0198593 A1* | 6/2019 | Jo | H01L 51/5215 |
| 2020/0044002 A1* | 2/2020 | Jun | H01L 27/3246 |
| 2021/0242421 A1* | 8/2021 | Okada | H05B 33/06 |

FOREIGN PATENT DOCUMENTS

| | | |
|---|---|---|
| JP | 2007-141862 A | 6/2007 |
| JP | 2015-138612 A | 7/2015 |
| JP | 2017-062902 A | 3/2017 |
| WO | 2016/084727 A1 | 6/2016 |

* cited by examiner

STEP INCLINED BY 5 DEGREES

STEP INCLINED BY 10 DEGREES

STEP INCLINED BY 20 DEGREES

STEP INCLINED BY 30 DEGREES

DISPLAY DEVICE AND MANUFACTURING METHOD OF DISPLAY DEVICE, AND ELECTRONIC DEVICE

TECHNICAL FIELD

The present disclosure relates to a display device and a manufacturing method of a display device, and an electronic device.

BACKGROUND ART

In recent years, a display device of a flat type (flat panel type) is mainly used as a display device. As one of the flat type display devices, there is a display device using a so-called current-driven electro-optical element whose light emission luminance changes according to a current value flowing through a device as a light emitting unit (light emitting element) of a pixel. As a current-driven electro-optical element, an organic EL element using electroluminescence (EL) of an organic material and utilizing a phenomenon in which light is emitted when an electric field is applied to an organic thin film is known.

An organic EL display device using an organic EL element as a light emitting unit of a pixel has a structure in which a base structure such as a transistor element, a capacitive element, and a wiring in a pixel region is flattened, and a dimensional variation due to a focus shift of a resist pattern when forming a wiring or a contact is suppressed. However, in a case of a structure in which a portion up to an anode electrode of the organic EL element is flattened, the amount of light taken in at an end portion of the pixel region is weak as compared to an optical axis design of a lens used in combination with an organic EL display device, and therefore, the viewing angle characteristic deteriorates.

As an example for improving this viewing angle characteristic, a technology of inclining an anode electrode of an organic EL element with respect to a substrate surface is disclosed in, for example, Patent Document 1 (US Patent Application Publication No. 2016/0226013). Patent Document 1 discloses a technology for inclining an electrode surface of an anode electrode with respect to a substrate surface by devising a wiring structure of a lower layer of an anode electrode of an organic EL element.

CITATION LIST

Patent Document

Patent Document 1: US Patent Application Publication No. 2016/0226013

SUMMARY OF THE INVENTION

Problems to be Solved by the Invention

In the conventional technology disclosed in Patent Document 1 described above, in a flattened layer below an anode electrode of an organic EL element, for each pixel, a surface of a flattened layer is inclined by forming a specific structure or the like, and an anode electrode is formed on the inclined surface, so that the electrode surface is inclined with respect to the substrate surface. As described above, in the conventional technology, a specific structure or the like is formed for each pixel to incline the surface of the flattened layer to set the inclination angle of the anode electrode. Accordingly, it is difficult to freely set an arbitrary inclination angle for each pixel with respect to the inclination angle of the anode electrode with respect to the substrate surface.

An object of the present disclosure is to provide a display device and a manufacturing method of a display device, and an electronic device capable of freely setting an inclination angle of an anode electrode with respect to a substrate surface for each pixel.

Solutions to Problems

A display device of the present disclosure for achieving the object described above includes a pixel region including a pixel including a light emitting unit arranged on a substrate, in the pixel region, an anode electrode of the light emitting unit is provided with a region including a pixel inclined with respect to a substrate surface, and an electrode surface of the anode electrode has an inclination angle according to a surface shape of a base insulating layer.

Furthermore, a manufacturing method of a display device of the present disclosure for achieving the object described above includes in manufacturing the display device having a pixel region in which a pixel including a light emitting unit is arranged on a substrate, providing, in the pixel region, a region in which an anode electrode of the light emitting unit includes a pixel inclined with respect to a substrate surface, and forming an electrode surface of the anode electrode at an inclination angle according to a surface shape of a base insulating layer.

Furthermore, an electronic device of the present disclosure for achieving the object described above includes the display device having the above-described configuration.

MODE FOR CARRYING OUT THE INVENTION

Figure 1:
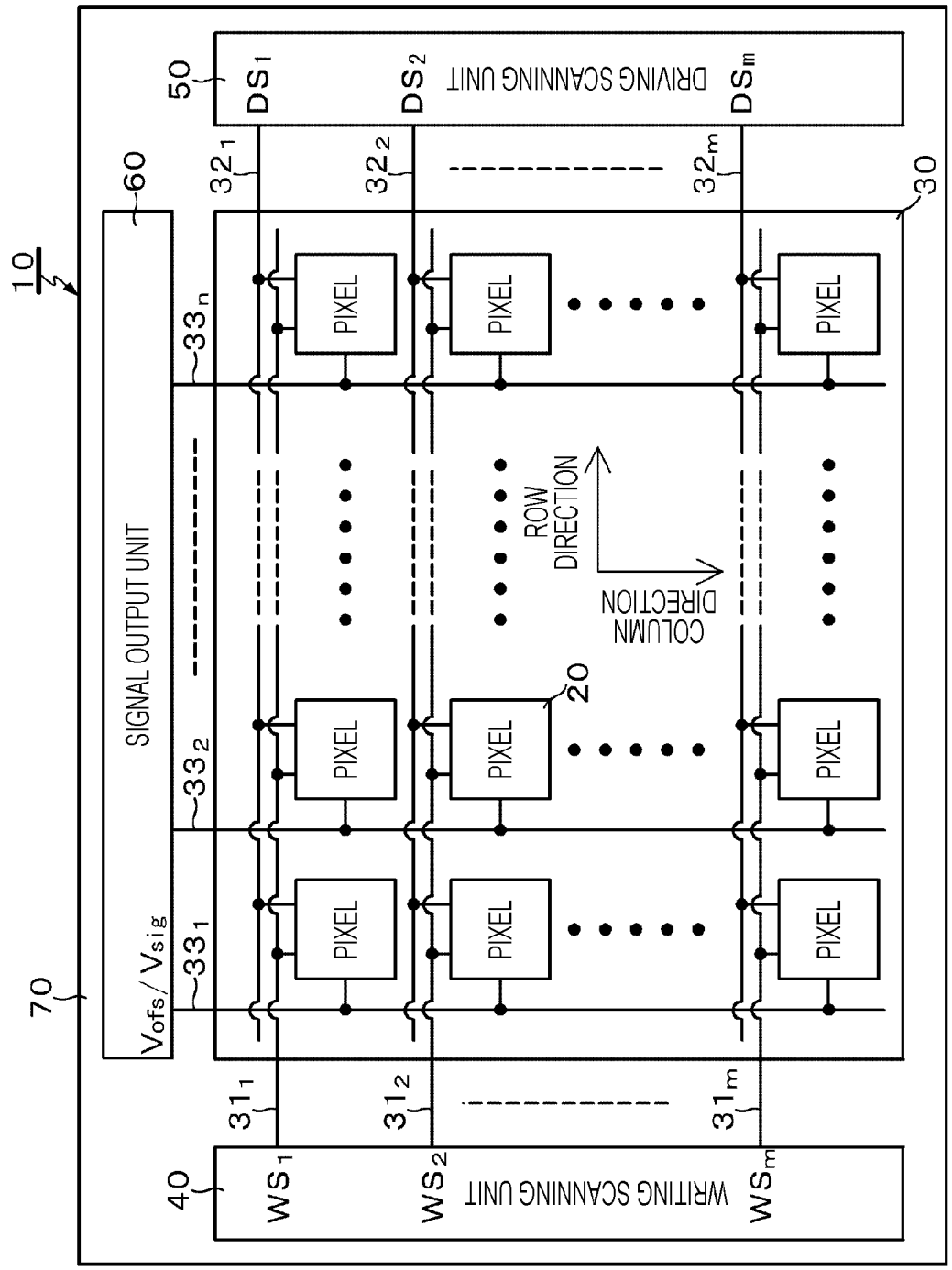
FIG. 1 is a system configuration diagram schematically showing a configuration of an active matrix type organic EL display device which is an example of a display device of the present disclosure.

Hereinafter, modes (hereinafter, referred to as "embodiments") for implementing the technology of the present disclosure will be described in detail with reference to the drawings. The technology of the present disclosure is not limited to the embodiments, and various numerical values, materials, and the like in the embodiments are examples. In the following description, the same reference numerals will be used for the same elements or elements having the same function, and redundant description will be omitted. Note that the description will be given in the following order.

1. Description of display device and manufacturing method thereof of the present disclosure, electronic device, and general
2. Display device of the present disclosure
    2-1. System configuration
    2-2. Pixel circuit
    2-3. Basic pixel structure
    2-4. Viewing angle characteristic
3. Description of embodiments
    3-1. First embodiment (example of a case where surface shape of base insulating layer is stepped shape)
    3-2. Second embodiment (modification of first embodiment: example in which inclination angle of anode electrode is asymmetrical)
    3-3. Third embodiment (modification of first embodiment: example in which electrode surface of anode electrode has stepped shape)
    3-4. Fourth embodiment (modification of first embodiment: example of a case where anode electrode has reflector effect)
    3-5. Fifth embodiment (modification of first embodiment: example corresponding to cavity structure)
    3-6. Sixth embodiment (modification of first embodiment: another example of processing stepped shape of base insulating layer)
    3-7. Seventh embodiment (modification of first embodiment: design example for inclination angle of anode electrode)
    3-8. Eighth embodiment (example of manufacturing method of organic EL display device)
4. Modification
5. Electronic device of the present disclosure
    5-1. First specific example (example of digital still camera)
    5-2. Second specific example (example of head mounted display)
6. Configuration that the present disclosure can take <Description of Display Device and Manufacturing Method Thereof of the Present Disclosure, Electronic Device, and General>

In a display device and a manufacturing method thereof, and an electronic device of the present disclosure, a surface shape of a base insulating layer can be a stepped shape. Then, an anode electrode can have a configuration of being formed on the stepped shape of the base insulating layer. An inclination angle of an electrode surface of the anode electrode can be determined by the depth of steps, the number of steps, and the step width of the stepped shape of the base insulating layer.

In the display device and the manufacturing method thereof, and the electronic device of the present disclosure including the above-described preferable configuration can have a configuration in which the stepped shape of the base insulating layer is embedded with a metal material and smoothed. Then, the anode electrode can have a configuration of being formed on the smoothed portion of the base insulating layer.

Furthermore, the display device and the manufacturing method thereof, and the electronic device of the present disclosure including the above-described preferable configuration can have a configuration in which inclination angles of the electrode surface of the anode electrode are symmetrical in a first direction and a second direction with respect to the electrode center in plan view.

Alternatively, the display device and the manufacturing method thereof, and the electronic device of the present disclosure including the above-described preferable configuration can have a configuration in which inclination angles of the electrode surface of the anode electrode are asymmetrical in the first direction with respect to the electrode center in plan view, and one of asymmetrical electrode surface sides is a non-light emitting unit side. At this time, the anode electrode can have a structure in which presence or absence of a reflection effect due to presence or absence of the metal material on the electrode surface on the non-light emitting unit side can be selected.

Furthermore, the display device and the manufacturing method thereof, and the electronic device of the present disclosure including the above-described preferable configuration can have a configuration in which the anode electrode is formed directly on the stepped shape of the base insulating layer, and the electrode surface has the stepped shape, or has an electrode surface shape having a reflector effect.

Furthermore, the display device and the manufacturing method thereof, and the electronic device of the present disclosure including the above-described preferable configuration can have a configuration in which one pixel that is a unit for forming a color image includes subpixels of a plurality of colors, and, in a case of having a cavity structure that utilizes a resonance effect of light between the cathode electrode and the anode electrode of the light emitting unit, a step is provided for each of the subpixels of a plurality of colors on the formation surface of the anode electrode of the base insulating layer. At this time, a configuration can be made in which the subpixels of a plurality of colors include subpixels of three primary colors of red, green, and blue, and the formation surface of the anode electrodes of the other subpixels is determined on the basis of the formation surface of the anode electrode of the red subpixel.

Furthermore, the display device and the manufacturing method thereof, and the electronic device of the present disclosure including the above-described preferable configuration can have a configuration in which, each step of the stepped shape of the base insulating layer is subjected to processing of making a side surface tapered, or processing of removing a corner. Furthermore, the light emitting unit can include an organic EL element.

<Display Device of the Present Disclosure>

The display device of the present disclosure is an active matrix type display device in which a current flowing through an electrooptic element is controlled by an active element provided in the same pixel circuit as the electrooptic element, for example, an insulated gate field effect transistor. As the insulated gate type field effect transistor, typically, a metal oxide semiconductor (MOS) transistor and a thin film transistor (TFT) can be exemplified.

Here, described as an example is an active matrix type organic EL display device using, for example, an organic EL element that is a current driven type electrooptic element whose light emission luminance changes according to a current value flowing in the device, as a light emitting unit (light emitting element) of a pixel circuit. Hereinafter, the "pixel circuit" may be simply described as "pixel".

[System Configuration]

FIG. 1 is a system configuration diagram schematically showing a configuration of the active matrix type organic EL display device which is an example of a display device of the present disclosure. As shown in FIG. 1, an organic EL display device 10 includes a pixel array unit 30 in which a plurality of pixels 20 including organic EL elements is two-dimensionally arranged in a matrix, and a peripheral circuit (peripheral drive unit) arranged in a periphery of the pixel array unit 30. Hereinafter, the region of the pixel array unit 30 is described as a pixel region in some cases.

For example, the peripheral circuit of the pixel region includes a writing scanning unit 40 equipped on a display panel 70 that is the same as where the pixel array unit 30 is, a driving scanning unit 50, a signal output unit 60, and the like, and drives each pixel 20 of the pixel array unit 30. Note that any or all of the writing scanning unit 40, the driving scanning unit 50, and the signal output unit 60 can be provided outside the display panel 70.

As the substrate of the display panel 70, an insulating transparent substrate such as a glass substrate or a semiconductor substrate such as a silicon substrate can be used. An organic EL display device using a semiconductor substrate such as a silicon substrate as a substrate of the display panel 70 is called a so-called micro display (small display), and is suitable for use as an electronic viewfinder of a digital still camera, a display unit of a head mounted display, and the like.

The organic EL display device 10 can be configured to be compatible with monochrome (black and white) display, or can be configured to be compatible with color display. In a case where the organic EL display device 10 is compatible with color display, one pixel (unit pixel/pixel) as a unit for forming a color image includes a plurality of subpixels. At this time, each of the subpixels corresponds to the pixel 20 in FIG. 1. More specifically, in a display device compatible with color display, one pixel includes, for example, three subpixels, that is, a subpixel that emits red (R) light, a subpixel that emits green (G) light, and a subpixel that emits blue (B) light.

However, the one pixel is not limited to a combination of subpixels of three primary colors of RGB, and it is also possible to form one pixel by further adding subpixels of one or more colors to the subpixels of three primary colors. More specifically, for example, in order to improve the luminance, a subpixel emitting white (W) light can be added to form one pixel, or at least one subpixel emitting complementary color light for enlarging the color reproduction range can be added to form one pixel.

In the pixel array unit 30, scanning lines 31 ($31_1$ to $31_m$), and driving lines 32 ($32_1$ to $32_m$) are wired for each pixel row along the first direction (row direction/horizontal direction) with respect to the array of the pixels 20 of m rows and n columns. Moreover, signal lines 33 ($33_1$ to $33_n$) are wired for each pixel column along the second direction (column direction/vertical direction) with respect to the array of the pixels 20 of m rows and n columns.

The scanning lines $31_1$ to $31_m$ are respectively connected to output ends of the corresponding rows of the writing scanning unit 40. The driving lines $32_1$ to $32_m$ are respectively connected to output ends of the corresponding rows of the driving scanning unit 50. The signal lines $33_1$ to $33_n$ are respectively connected to output ends of the corresponding columns of the signal output unit 60.

The writing scanning unit 40 includes a shift register circuit or the like. When writing a signal voltage of a video signal to each pixel 20 of the pixel array unit 30, the writing scanning unit 40 sequentially supplies writing scanning signals WS ($WS_1$ to $WS_m$) to the scanning lines 31 ($31_1$ to $31_m$), so that each pixel 20 of the pixel array unit 30 is sequentially scanned in units of row, that is, so-called line sequential scanning is performed.

As similar to the writing scanning unit 40, the driving scanning unit 50 includes a shift register circuit or the like. In synchronization with the line sequential scanning by the writing scanning unit 40, the driving scanning unit 50 supplies light emission control signals DS ($DS_1$ to $DS_m$) to the driving lines 32 ($32_1$ to $32_m$) to control light emission/non-light emission (light extinction) of the pixel 20.

The signal output unit 60 selectively outputs a signal voltage (hereinafter, sometimes referred to simply as "signal voltage") $V_{sig}$ of a video signal corresponding to luminance information supplied from a signal supply source (not shown), and a reference voltage $V_{ofs}$. Here, the reference voltage $V_{ofs}$ is a voltage corresponding to a voltage as a reference of the signal voltage $V_{sig}$ of the video signal (for example, a voltage corresponding to the black level of the video signal), or a voltage in the vicinity thereof. The reference voltage $V_{ofs}$ is used as an initialization voltage when correction operation is performed.

The signal voltage $V_{sig}$/reference voltage $V_{ofs}$ alternatively output from the signal output unit 60 is written to each pixel 20 of the pixel array unit 30 via the signal lines 33 ($33_1$ to $33_n$) in units of pixel rows selected by line sequential scanning by the writing scanning unit 40. In other words, the signal output unit 60 adopts a line sequential writing drive mode in which the signal voltage $V_{sig}$ is written in units of pixel rows (lines).

[Pixel Circuit]

Figure 2:
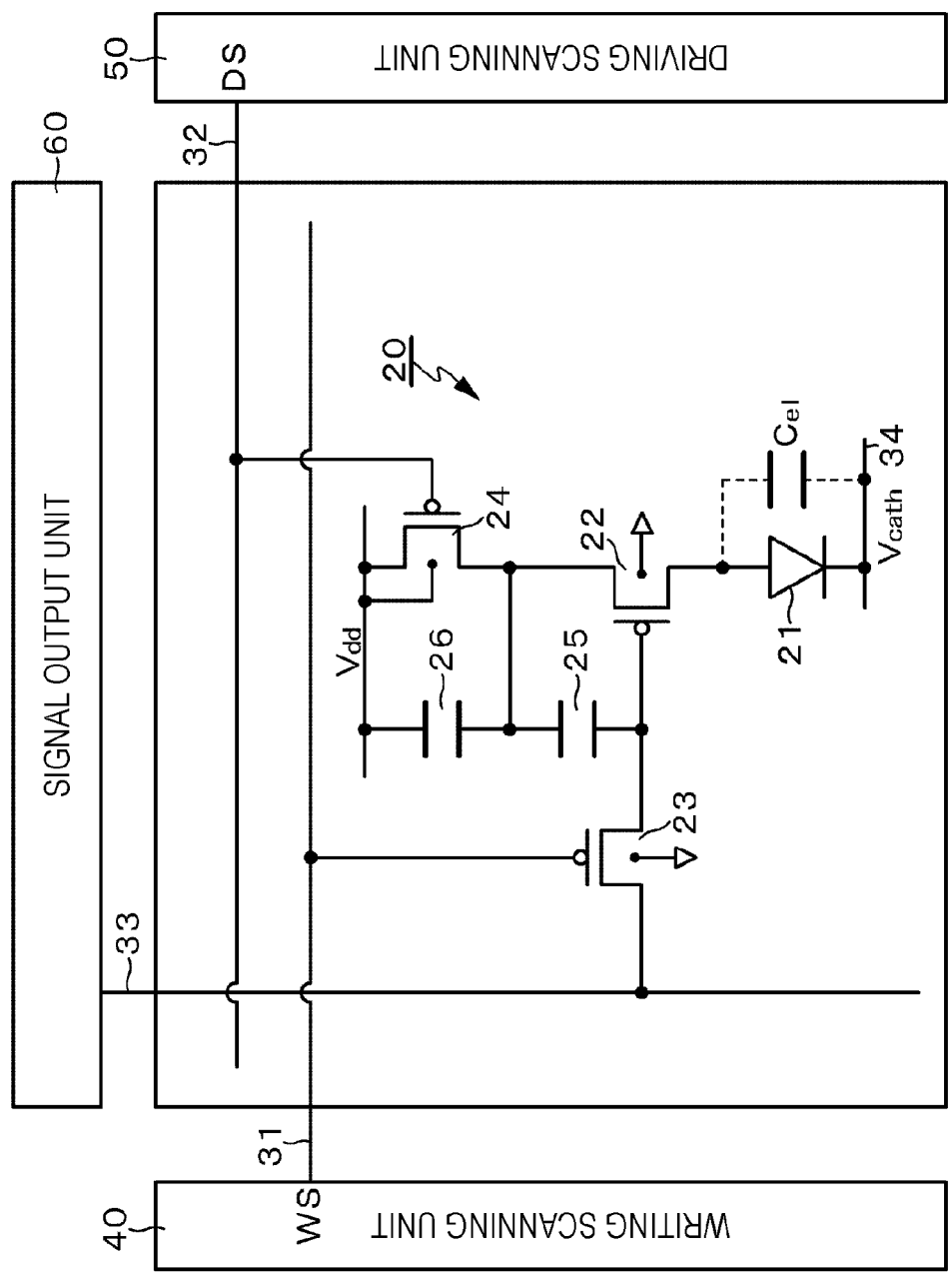
FIG. 2 is a circuit diagram showing an example of a circuit configuration of a pixel (pixel circuit) in the active matrix type organic EL display device.

FIG. 2 is a circuit diagram showing an example of a circuit configuration of a pixel (pixel circuit) in the active matrix type organic EL display device 10. The light emitting unit of the pixel 20 includes an organic EL element 21. The organic EL element 21 is an example of a current driven type electrooptic element in which the light emission luminance changes according to a current value flowing in the device.

As shown in FIG. 2, the pixel 20 includes an organic EL element 21 and a drive circuit (pixel drive circuit) for driving the organic EL element 21 by applying a current to the organic EL element 21. In the organic EL element 21, a cathode electrode is connected to a common power supply line 34 wired in common for all the pixels 20. In the drawing, $C_{el}$ is the equivalent capacitance of the organic EL element 21.

The drive circuit that drives the organic EL element 21 includes a driving transistor 22, a sampling transistor 23, a light emission control transistor 24, a holding capacitor 25, and an auxiliary capacitor 26. Here, assuming that the organic EL element 21 and its drive circuit are formed on a semiconductor such as silicon, not on an insulator such as glass, and a configuration is made in which a P-channel type transistor is used as the driving transistor 22.

Furthermore, in this example, as similar to the driving transistor 22, the sampling transistor 23 and the light emission control transistor 24 have a configuration in which a P-channel type transistor is used. Accordingly, the driving transistor 22, the sampling transistor 23, and the light emission control transistor 24 do not have three terminals, that is, source/gate/drain, but have four terminals, that is, source/gate/drain/back gate. A power supply voltage $V_{dd}$ is applied to the back gate.

However, the sampling transistor 23 and the light emission control transistor 24 are switching transistors that function as switching elements, and are not limited to P-channel transistors. Accordingly, the sampling transistor 23 and the light emission control transistor 24 may be N-channel transistors or may have a configuration in which P-channel transistors and N-channel transistors are mixed.

In the pixel 20 having the configuration described above, the sampling transistor 23 samples the signal voltage $V_{sig}$ of the video signal supplied from the signal output unit 60 through the signal line 33 to write the signal voltage $V_{sig}$ to the holding capacitor 25. The light emission control transistor 24 is connected between the node of the power supply voltage $V_{dd}$ and the source electrode of the driving transistor 22, and controls the light emission/non-light emission of the organic EL element 21 under the drive by the light emission control signal DS.

The holding capacitor 25 is connected between the gate electrode and the source electrode of the driving transistor 22. The holding capacitor 25 holds the signal voltage $V_{sig}$ of the video signal written by sampling by the sampling transistor 23. The driving transistor 22 applies a driving current corresponding to the holding voltage of the holding capacitor 25 to the organic EL element 21 to drive the organic EL element 21.

The auxiliary capacitor 26 is connected between the source electrode of the driving transistor 22 and a node of a fixed potential, for example, a node of the power supply voltage $V_{dd}$. The auxiliary capacitor 26 has an action of suppressing the fluctuation of the source potential of the driving transistor 22 when the signal voltage $V_{sig}$ of the video signal is written, and an action of setting a gate-source voltage $V_{gs}$ of the driving transistor 22 to a threshold voltage $V_{th}$ of the driving transistor 22.

[Basic Pixel Structure]

Figure 3:
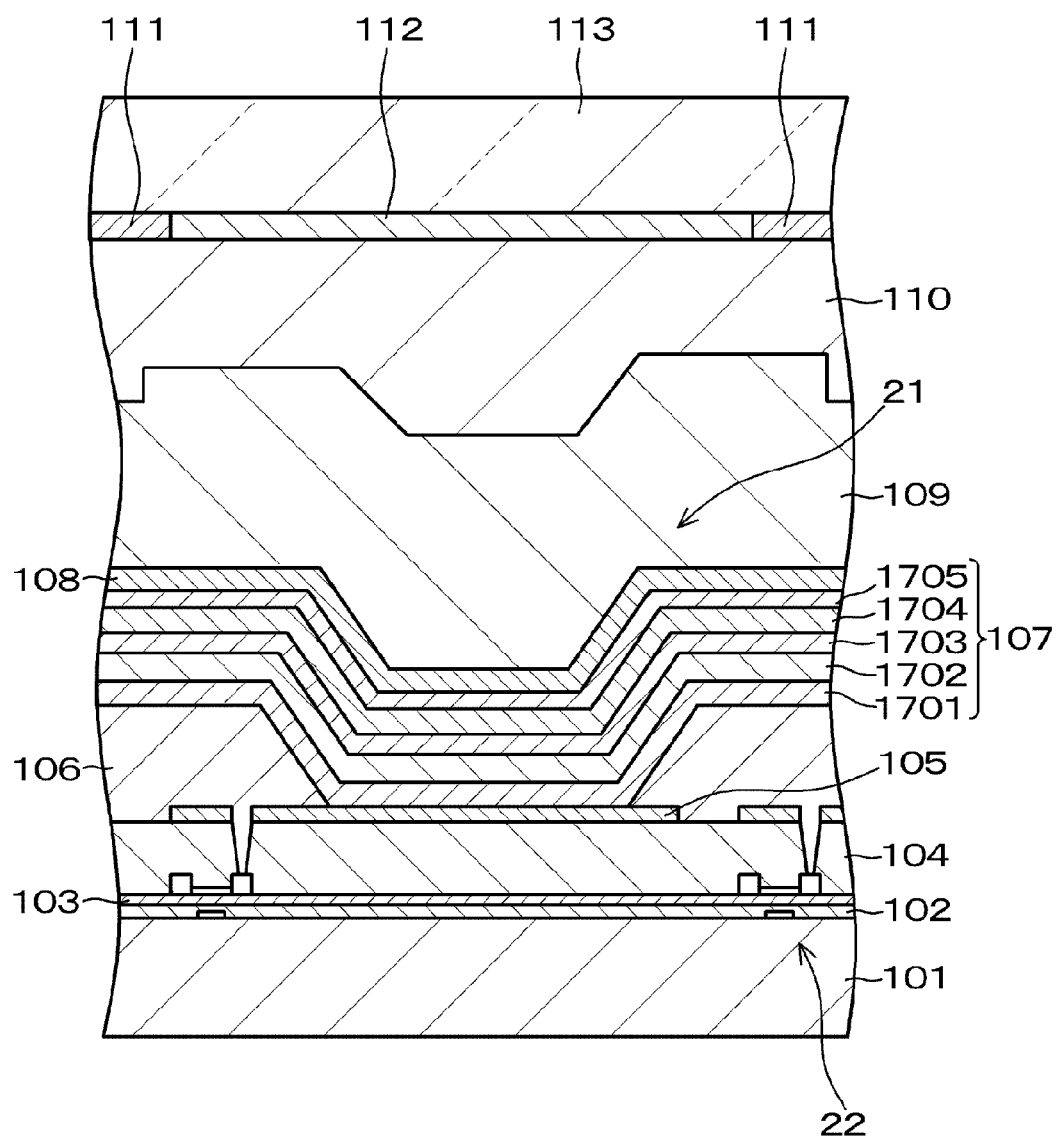
FIG. 3 is a cross-sectional view showing a basic pixel structure.

Here, the basic pixel structure of the pixel 20 will be described with reference to the cross-sectional view of FIG. 3. The display panel 70 including the pixel structure exemplified here is, for example, an upper surface emission type (so-called top emission type) display panel that emits any of red (R), green (G), and blue (B) colored light from a panel upper surface (the surface opposite to a substrate 101) side in combination of a white organic EL element that emits white light and a color filter.

The region on the substrate 101 that constitutes the display panel 70 includes an effective pixel region (display region) in which a plurality of pixels 20 is arranged in a matrix, and a periphery region located on the periphery (outer edge side/outer periphery side) of the effective pixel region. In the effective pixel region, a pixel drive circuit including the driving transistor 22, the sampling transistor 23, the light emission control transistor 24, the holding capacitor 25, and the auxiliary capacitor 26 is provided. In the peripheral region, a peripheral circuit including the writing scanning unit 40, the driving scanning unit 50, the signal output unit 60, and the like is provided. Then, a circuit layer 102 including these circuits is formed on the substrate 101.

The display panel 70 has a layered structure in which, on the circuit layer 102, for example, an inorganic insulating layer 103, a base insulating layer 104, an anode electrode 105, an organic insulating layer 106, an organic EL layer 107, a cathode electrode 108, an organic protective layer 109, a filler layer (adhesion layer) 110, and a black matrix layer 111 are layered in this order. Note that a color filter 112 is provided in the same layer as the black matrix layer 111 for each pixel. Furthermore, a sealing substrate 113 is attached to the layered structure, and the layered structure is sealed by the sealing substrate 113.

In the pixel structure described above, the anode electrode 105, the organic EL layer 107, and the cathode electrode 108 have a layered structure including the above-described white organic EL element. The anode electrode 105 is provided for each pixel 20 of each color in the effective pixel region. The cathode electrode 108 includes a transparent electrode, and is provided as an electrode common to each pixel 20 in the effective pixel region.

The organic EL layer 107 has a layered structure in which a hole injection layer 1071, a hole transport layer 1072, a light emitting layer 1073, an electron transport layer 1074, and an electron injection layer 1075 are layered in this order from the anode electrode 105 side. Of these layers, layers other than the light emitting layer 1073 may be provided as needed.

The hole injection layer 1071 is provided to increase hole injection efficiency and prevent leakage. The hole transport layer 1072 is for improving the efficiency of transporting holes to the light emitting layer 1073. In the light emitting layer 1073, recombination of electrons and holes occurs when an electric field is applied, and light is generated. The electron transport layer 1074 is for increasing the efficiency of transporting electrons to the light emitting layer 1073. The electron injection layer 1075 is for increasing electron injection efficiency.

As described above, the organic EL display device 10 has a configuration in which the base insulating layer 104 is provided in a state of covering the circuit unit (pixel drive circuit or peripheral circuit) formed on the substrate 101, and the organic EL element 21 is formed on the base insulating layer 104. Then, the organic EL display device 10 has a pixel structure in which the anode electrode 105 as a lower electrode is provided for each pixel under the organic EL element 21, the cathode electrode 108 as an upper electrode is provided for all pixels in common above the organic EL element 21, and portion up to the anode electrode 105 is flattened.

[Viewing Angle Characteristic]

Figure 4:
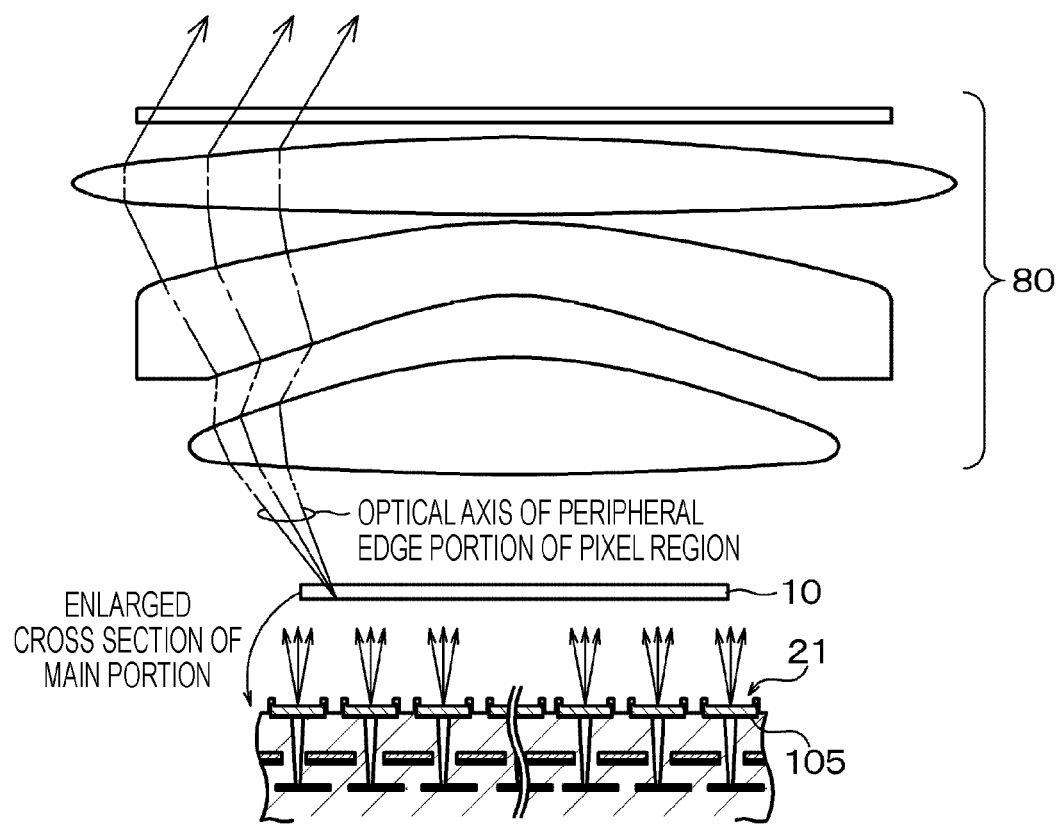
FIG. 4 is a diagram for explaining a reason why a viewing angle characteristic of a peripheral edge portion of a pixel region is worse than that of a central portion.

By the way, for example, in a case of a microdisplay using a semiconductor substrate such as a silicon substrate as the substrate 101 of the display panel 70, as shown in FIG. 4, the organic EL display device 10 is used in combination with a lens (lens group) 80. In this case, the organic EL display device 10 serves as a divergent light source for the lens 80. Then, regarding the amount of light in the peripheral edge portion (end portion) of the pixel region of the organic EL display device 10, obliquely incident light is taken into the lens 80 as a main light component due to the optical axis design of the lens 80. At this time, in the organic EL display device 10 having the above-described normal pixel structure, that is, the pixel structure in which the portion up to the anode electrode 105 of the organic EL element 21 is flattened, the light obliquely emitted from the organic EL element 21 becomes weak, so that the viewing angle characteristic of the peripheral edge portion of the pixel region becomes worse (degraded) than the viewing angle characteristic of the central portion of the pixel region.

DESCRIPTION OF EMBODIMENTS

Therefore, in the present embodiment, in order to improve the viewing angle characteristic, a region is provided in the pixel region (region of the pixel array unit 30), the region including the pixel 20 having a pixel structure in which the electrode surface of the anode electrode 105 of the organic EL element 21 is inclined with respect to the substrate surface (surface of the substrate 101). Then, in inclining the electrode surface of the anode electrode 105 with respect to the substrate surface, the anode electrode 105 is formed on the surface shape of the base insulating layer 104, and the electrode surface of the anode electrode 105 is formed at an inclination angle corresponding to the surface shape.

Here, the surface shape of the base insulating layer 104 can be easily formed into an arbitrary shape at the stage of forming the base insulating layer 104. Then, by forming the anode electrode 105 on the surface shape of the base insulating layer 104, the inclination angle of the electrode surface of the anode electrode 105 is set to an angle according to the surface shape of the base insulating layer 104. Therefore, the inclination angle of the anode electrode 105 with respect to the substrate surface can be freely set for each pixel according to the surface shape of the base insulating layer 104, and thus a high viewing angle characteristic can be secured. In particular, it is possible to design the microdisplay used in combination with the lens 80 in accordance with the light taking-in optical axis of the lens 80, and thus it is possible to secure high viewing angle characteristic.

Specific examples of forming the anode electrode 105 having an inclination angle according to the surface shape of the base insulating layer 104 will be described below.

First Embodiment

Figure 5:
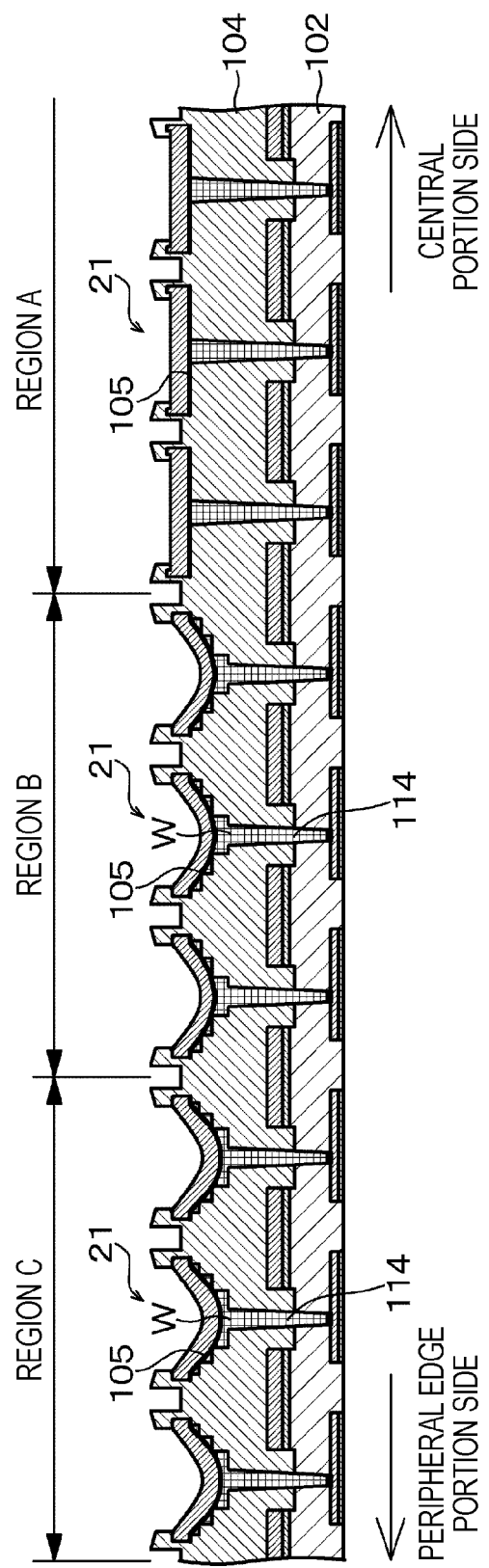
FIG. 5 is a cross-sectional view showing a cross-sectional structure of a main portion of a display panel according to a first embodiment.

A first embodiment is an example of a case where the surface shape of the base insulating layer 104 is a stepped shape. FIG. 5 shows a cross-section of a main portion of the display panel 70 according to the first embodiment. Here, for convenience, a case where the pixel region (effective pixel region) is divided into three regions, that is, a central region A, a region B adjacent to the region A, and a region C in the peripheral edge portion side is exemplified.

In the region A in the central portion of the pixel region, the base insulating layer 104 is formed so that its surface shape is flat. Therefore, in the region A, the electrode surface of the anode electrode 105 formed on the flat base insulating layer 104 is a flat surface parallel to the substrate surface. In the regions B and C, the base insulating layer 104 is formed so that its surface shape is a stepped shape. Therefore, in the regions B and C, the electrode surface of the anode electrode 105 formed on the stepped-shaped base insulating layer 104 is an inclined surface inclined with respect to the substrate surface.

The stepped corner portion of the base insulating layer 104 is smoothed by embedding a metal material, for example, tungsten (W) in the process of forming the contact unit 114. Accordingly, by forming the anode electrode 105 on the stepped shape of the base insulating layer 104 whose corners are smoothed, the electrode surface of the anode electrode 105 has a smooth inclined surface.

Here, regarding the stepped shape of the base insulating layer 104, by changing the inclination angle and the step width of the stepped shape, between the region B and the region C, the inclination angle of the anode electrode 105 in the region B and the inclination angle of the anode electrode 105 in the region C are made different. Specifically, the inclination angle of the stepped shape in the region B is set to 20 degrees, the step width in the region B is set to 0.275 μm, the inclination angle of the stepped shape in the region C is set to 30 degrees, and the step width in the region C is set to 0.173 μm. Note that the numerical values described above are examples and are not limited to these numerical values.

In the example described above, by setting the inclination angle and the step width of the stepped shape of the base insulating layer 104, the inclination angle of the anode electrode 105 in the region C becomes larger than the inclination angle of the anode electrode 105 in the region B. That is, in the entire pixel region, the electrode surface of the anode electrode 105 is a flat surface without inclination in the central region A, while the inclination angle of the electrode surface of the anode electrode 105 becomes larger toward the peripheral edge portion of the pixel region, in units of regions in this example.

Regarding the inclination angle of the stepped shape of the base insulating layer 104, an arbitrary angle can be set by changing the depth (height) d of the step, the number of steps, the step width w, and the like. A specific example of setting the inclination angle of the stepped shape will be described below. Here, the case where the anode electrode 105 is rectangular and the stepped shape of the base insulating layer 104, that is, the inclination angle of the anode electrode 105 is symmetrical in each of the up, down, right, and left directions with respect to the electrode center in plan view is exemplified. Here, in the relationship with the pixel array in FIG. 1, the right and left direction means the first direction (row direction), and the up and down direction means the second direction (column direction).

First Specific Example

Figure 6A:
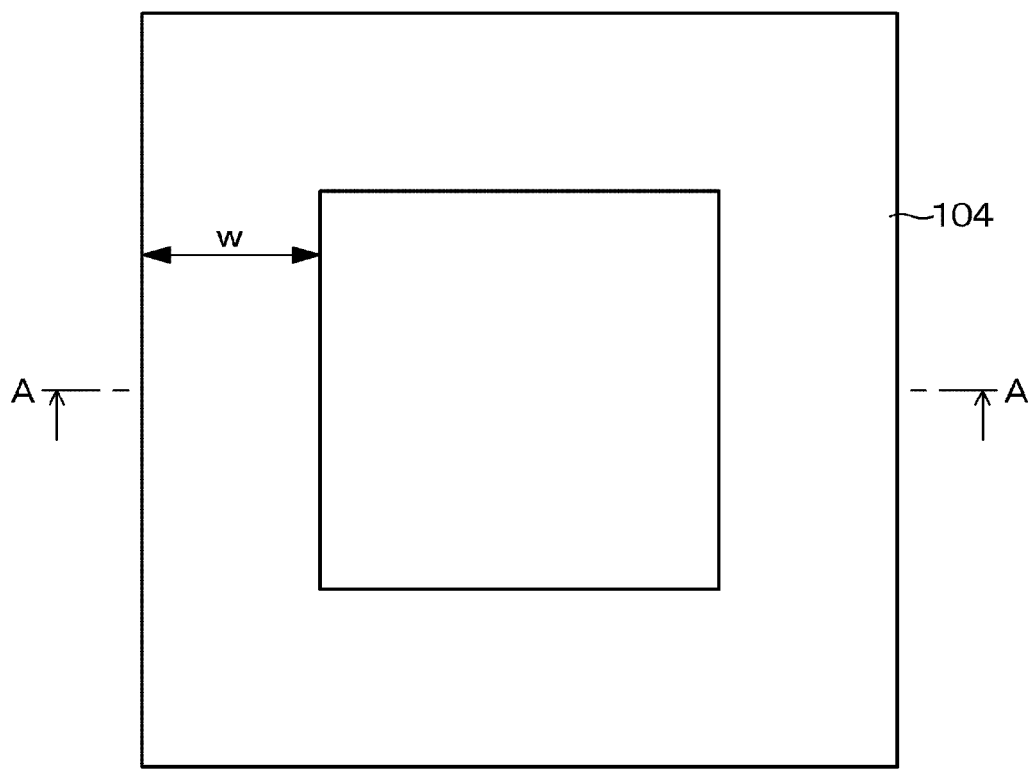
FIG. 6A is a plan view showing an angle setting of a stepped shape according to a first specific example.
Figure 6B:
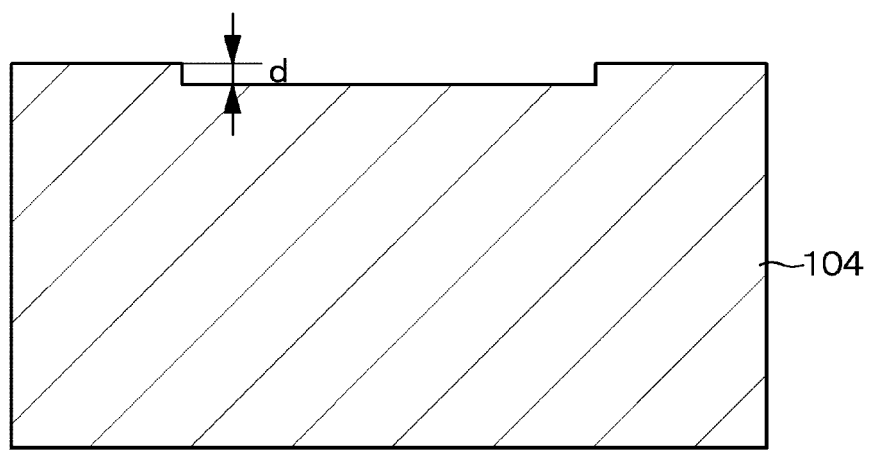
FIG. 6B is a cross-sectional view taken along line A-A of FIG. 6A.

FIG. 6A is a plan view showing an angle setting of a stepped shape according to a first specific example, and FIG. 6B is a cross-sectional view taken along line A-A of FIG. 6A. The first specific example is an example in which the depth d of the step is set to 0.05 μm, the number of steps is set to two, and the step width w is set to 0.572 μm. In this setting example, the inclination angle of the stepped shape of the base insulating layer 104 can be set to an angle of about 5 degrees.

Second Specific Example

Figure 7A:
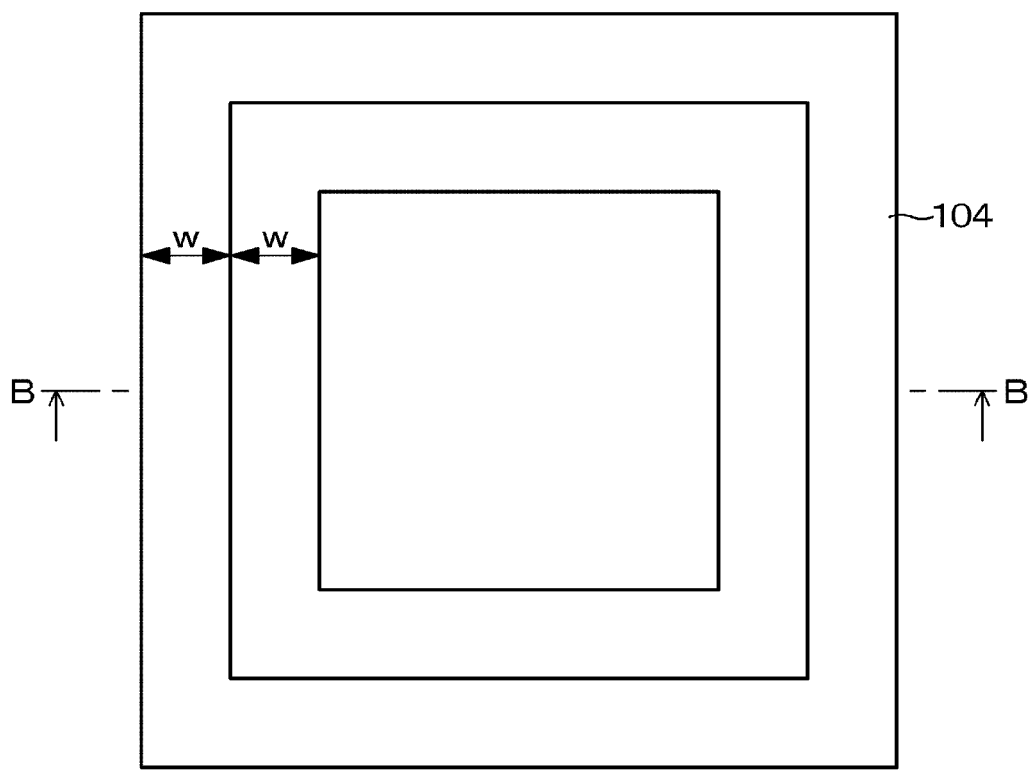
FIG. 7A is a plan view showing an angle setting of a stepped shape according to a second specific example.
Figure 7B:
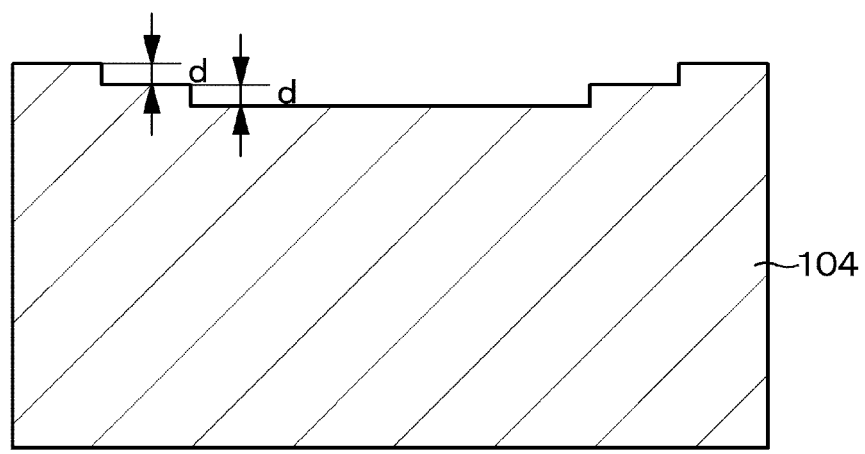
FIG. 7B is a cross-sectional view taken along line B-B of FIG. 7A.

FIG. 7A is a plan view showing an angle setting of a stepped shape according to a second specific example, and FIG. 7B is a cross-sectional view taken along line B-B of FIG. 7A. The second specific example is an example in which the depth d of the step is set to 0.05 μm, the number of steps is set to three, and the step width w is set to 0.284 μm. In this setting example, the inclination angle of the stepped shape of the base insulating layer 104 can be set to an angle of about 10 degrees.

Third Specific Example

Figure 8A:
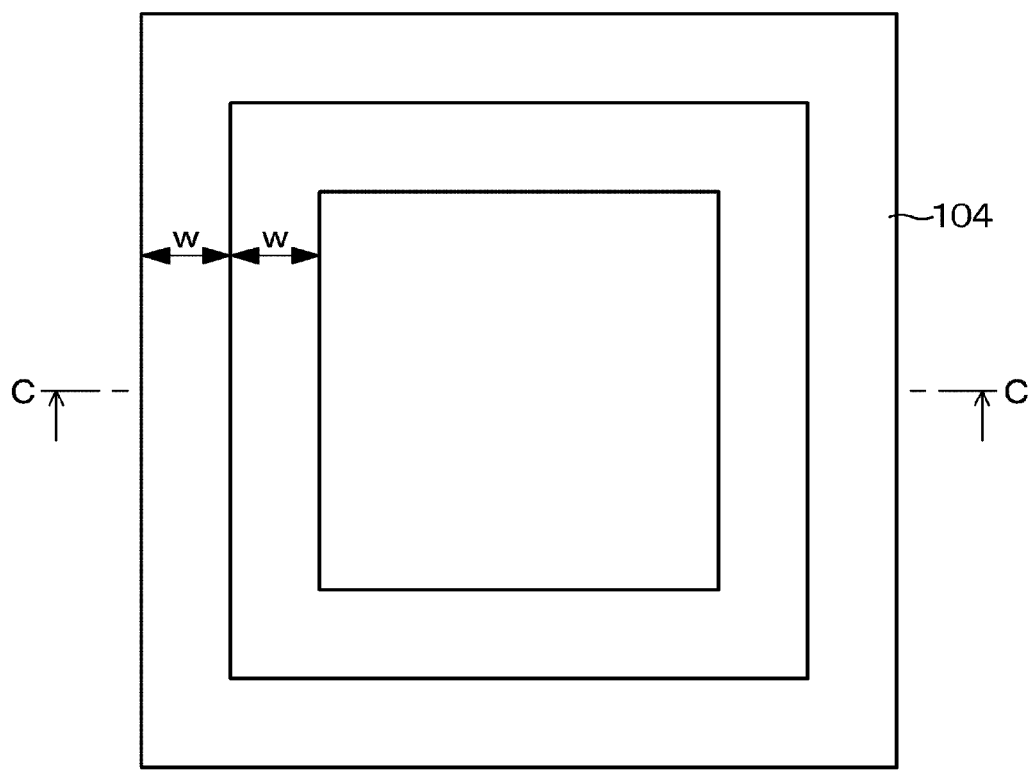
FIG. 8A is a plan view showing an angle setting of a stepped shape according to a third specific example.
Figure 8B:
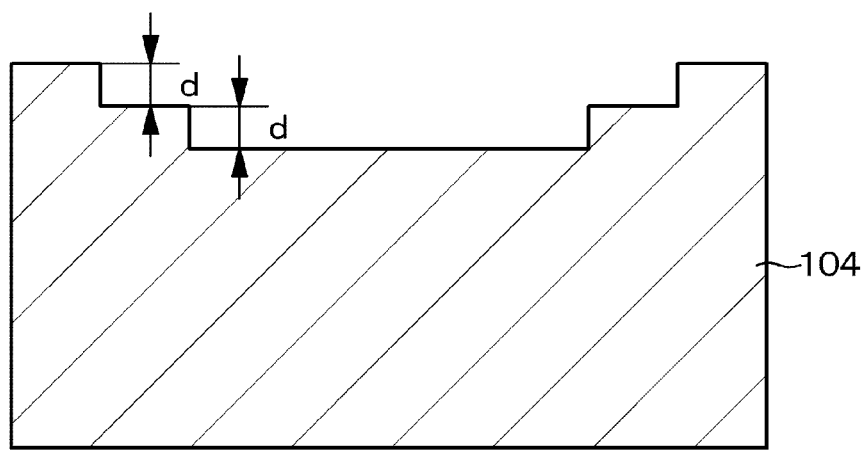
FIG. 8B is a cross-sectional view taken along line C-C of FIG. 8A.

FIG. 8A is a plan view showing an angle setting of a stepped shape according to a third specific example, and FIG. 8B is a cross-sectional view taken along line C-C of FIG. 8A. The third specific example is an example in which the depth d of the step is set to 0.10 μm, the number of steps is set to three, and the step width w is set to 0.275 μm. In this setting example, the inclination angle of the stepped shape of the base insulating layer 104 can be set to an angle of about 20 degrees.

Fourth Specific Example

Figure 9A:
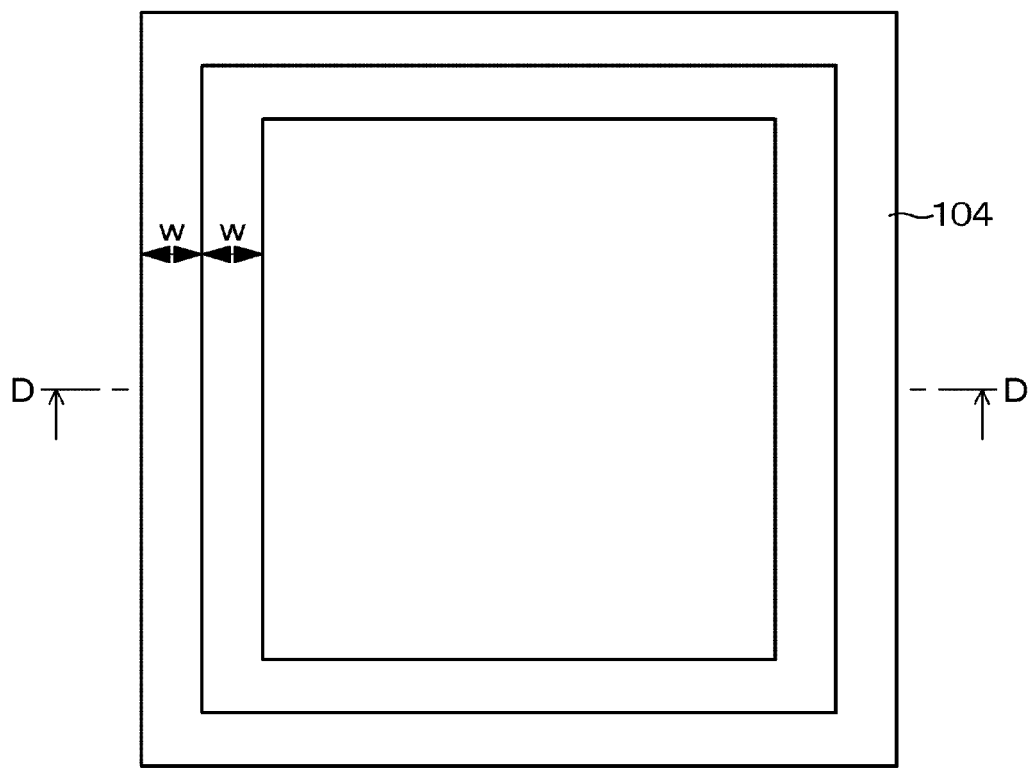
FIG. 9A is a plan view showing an angle setting of a stepped shape according to a fourth specific example.
Figure 9B:
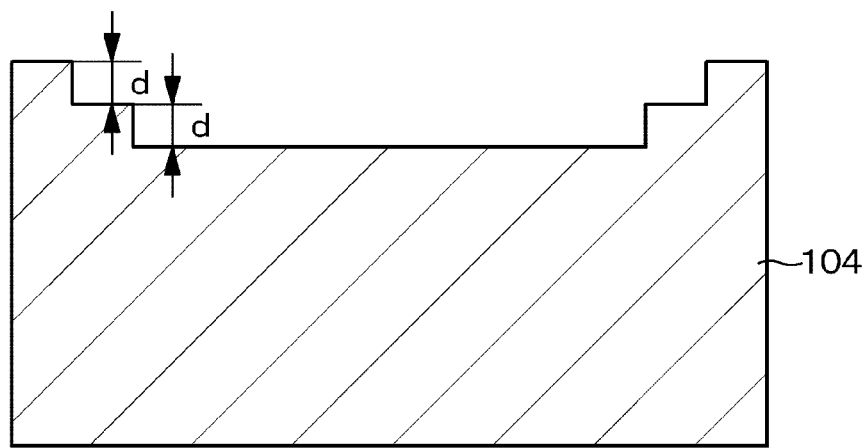
FIG. 9B is a cross-sectional view taken along line D-D of FIG. 9A.

FIG. 9A is a plan view showing an angle setting of a stepped shape according to a fourth specific example, and FIG. 9B is a cross-sectional view taken along line D-D of FIG. 9A. The fourth specific example is an example in which the depth d of the step is set to 0.10 μm, the number of steps is set to three, and the step width w is set to 0.173 μm. In this setting example, the inclination angle of the stepped shape of the base insulating layer 104 can be set to an angle of about 30 degrees.

In any of the first to fourth specific examples described above, in the stepped shape of the base insulating layer 104, the side surface of each step has a structure perpendicular to the substrate surface (the surface of the substrate 101). Here, "perpendicular" includes not only the case of being strictly perpendicular but also the case of being substantially perpendicular, and the existence of various variations caused in design or manufacturing is allowed. Furthermore, the numerical values for the depth d of the step, the number of steps, the step width w, and the inclination angle in each specific example are merely examples, and are not limited to these numerical values.

According to the first embodiment, a setting is made such that, in the entire pixel region, the electrode surface of the anode electrode 105 is a flat surface without inclination in the central region A, while the inclination angle of the electrode surface of the anode electrode 105 becomes larger toward the peripheral edge portion of the pixel region (becomes larger in units of regions in this example).

As described above, the base insulating layer 104 of the anode electrode 105 is processed under the setting of the design value in which the inclination angle, the step width, or the position and the number of steps are different for each arbitrary region of the pixel region, and thus, the base insulating layer 104 having a stepped surface shape can be easily formed in pixel units. Therefore, the anode electrode 105 having an inclination angle according to the surface shape of the base insulating layer can be formed on the base insulating layer 104 in pixel units. Then, since it is easy to form the surface shape of the base insulating layer 104 in pixel units, the anode electrode 105 can be freely designed to have different inclination angles in pixel units.

Second Embodiment

A second embodiment is a modification of the first embodiment and is an example in which the inclination angle of the anode electrode 105 is asymmetrical in the right and left direction (first direction/row direction) with respect to the electrode center in plan view. The structure in which the inclination angle of the anode electrode 105 is asymmetrical with respect to the electrode center in plan view can be achieved by changing the depth d of the step, the number of steps, and the step width w in the stepped shape of the base insulating layer 104 in the up, down, right, and left directions. Hereinafter, a specific example of the second embodiment will be described.

First Specific Example

Figure 10:
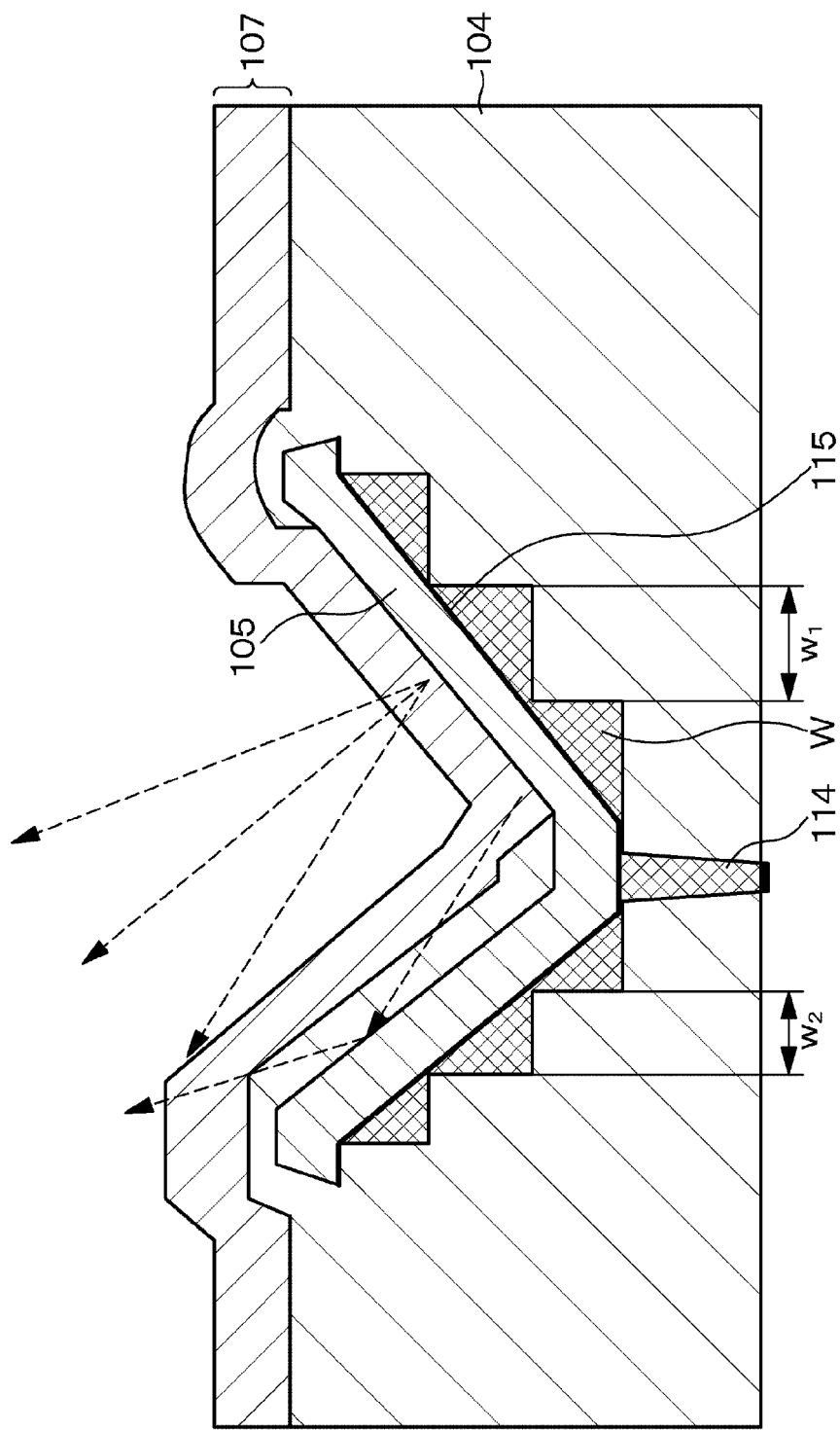
FIG. 10 is a cross-sectional view showing an anode electrode structure according to a first specific example of a second embodiment.

FIG. 10 shows a cross-sectional view showing a structure of the anode electrode 105 (hereinafter, sometimes abbreviated as "anode electrode structure") according to a first specific example of the second embodiment. Here, the case of a structure where the inclination angle of the anode electrode 105 is asymmetrical in the right and left direction (first direction/row direction) with respect to the electrode center in plan view is exemplified.

In the first specific example, the step width w of the step in the stepped shape of the base insulating layer 104 is changed in the right and left direction with respect to the electrode center in plan view, so that a structure in which the inclination angle of the anode electrode 105 is asymmetrical with respect to the electrode center in the right and left direction in plan view is achieved. Specifically, by setting the step width $w_1$ of the step on the right side of the drawing to be wider than the step width $w_2$ of the step on the left side of the drawing ($w_1 > w_2$), a structure is made in which the inclination angle of the electrode portion on the right side of the anode electrode 105 is gentler than that of the electrode portion on the left side. In the structure of the organic EL element 21, the right side of the anode electrode 105 in the drawing is the light emitting unit side of the organic EL layer 107, and the left side of the drawing is the non-light emitting unit side of the organic EL layer 107. This is similar in the specific examples as described later.

In the anode electrode structure according to the first specific example, a metal material, for example, tungsten (W) is embedded in the step portion of the base insulating layer 104 and the contact unit 114. Furthermore, a metal film 115 is formed on the back surface of the anode electrode 105. The metal film 115 is provided on both the right side (light emitting unit side) and the left side (non-light emitting unit side) of the anode electrode 105 in the drawing. Due to the presence of the metal film 115, it is possible to obtain a light-collecting effect by light reflection on the metal film 115 on the non-light emitting unit side of the organic EL layer 107. Furthermore, the metal material of the metal film 115 makes it possible to adjust the light-collecting effect. The metal film 115 can be formed by selectively layering aluminum (Al), aluminum alloy (AlCu, AlNi), tungsten (W), indium tin oxide (ITO), titanium (Ti), titanium oxide film (TiO), and the like.

Second Specific Example

Figure 11:
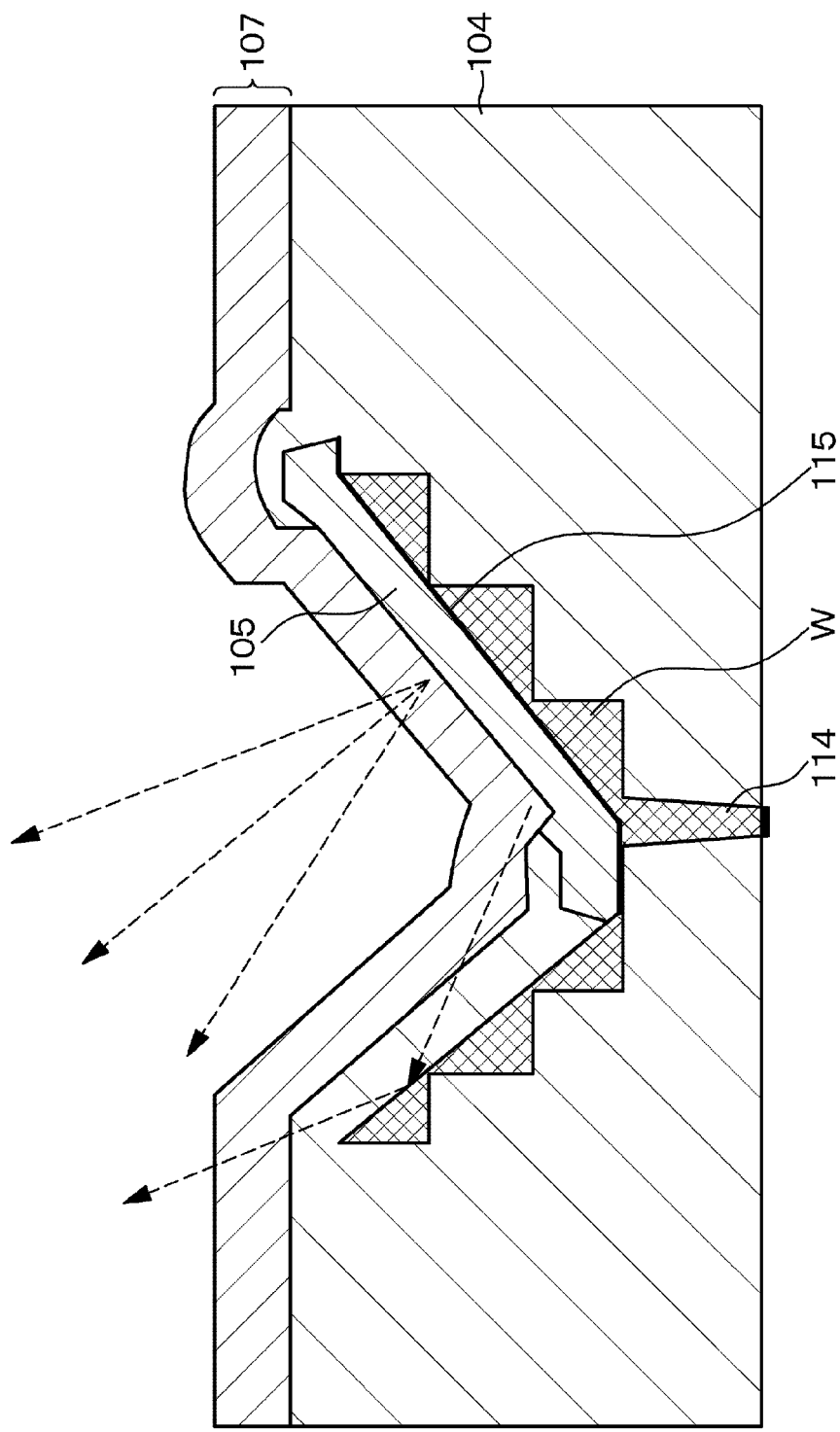
FIG. 11 is a cross-sectional view showing an anode electrode structure according to a second specific example of the second embodiment.

FIG. 11 shows a cross-sectional view of an anode electrode structure according to a second specific example of the second embodiment. Also in the case of the anode electrode structure according to the second specific example, as similar to the case of the anode electrode structure according to the first specific example, the inclination angle of the anode electrode 105 is asymmetrical in the right and left direction with respect to the electrode center in plan view.

However, in the anode electrode structure according to the first specific example, while the metal film 115 is formed on both the light emitting unit side and the non-light emitting unit side of the organic EL layer 107, the anode electrode structure of the second specific example has a pixel structure in which the anode electrode 105 does not exist on the non-light emitting unit side of the organic EL layer 107 and therefore the metal film 115 does not exist.

In the anode electrode structure according to the second specific example, on the non-light emitting unit side of the organic EL layer 107, although the effect of light reflection is obtained at the interface of the tungsten portion in which the step of the stepped shape of the base insulating layer 104 is embedded, the light-collection effect due to light reflection is lower than in the case of the first specific example in which the metal film 115 is formed.

Third Specific Example

Figure 12:
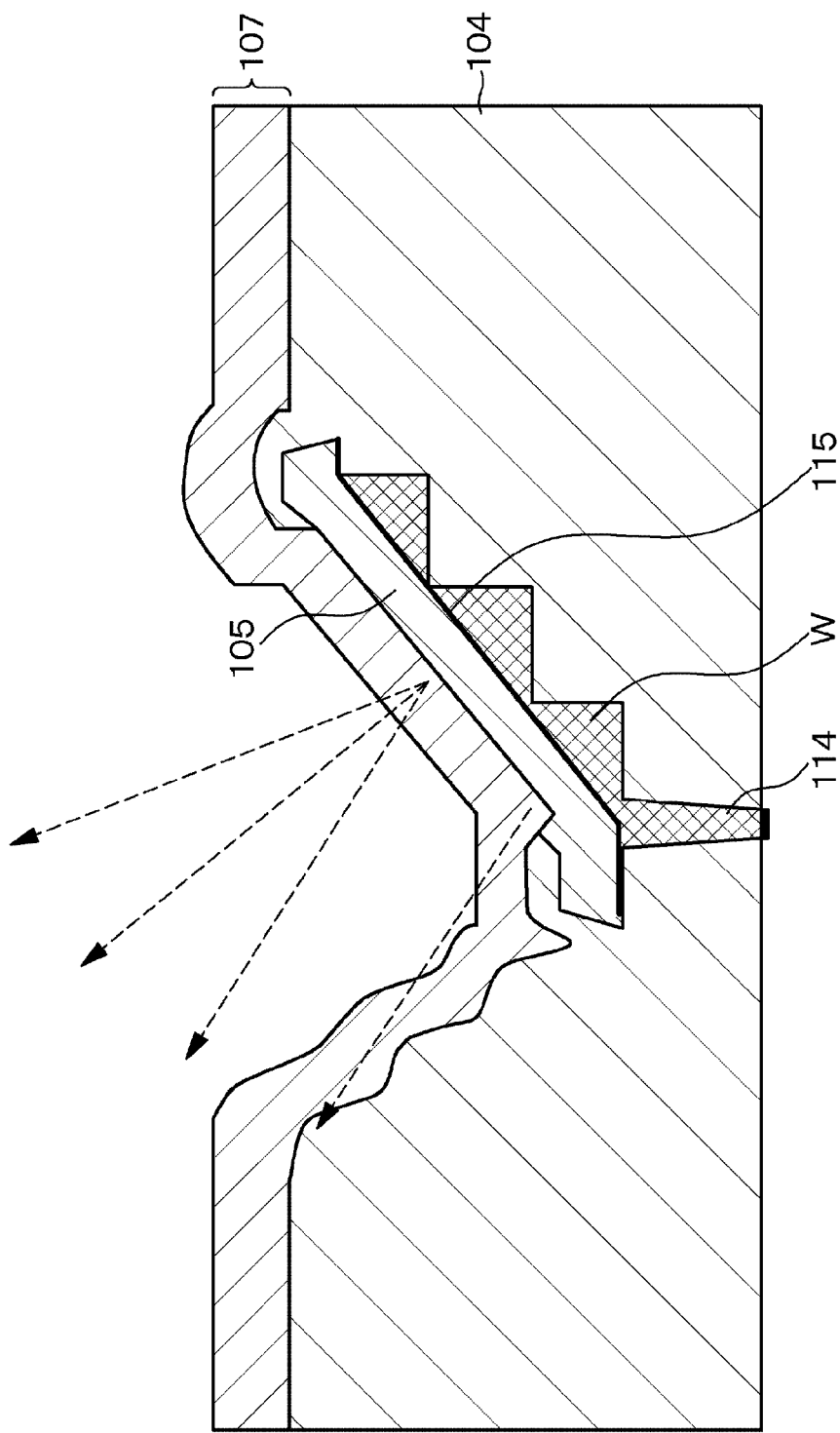
FIG. 12 is a cross-sectional view showing an anode electrode structure according to a third specific example of the second embodiment.

FIG. 12 shows a cross-sectional view of an anode electrode structure according to a third specific example of the second embodiment. Also in the case of the anode electrode structure according to the third specific example, as similar to the case of the anode electrode structure according to the first specific example, the inclination angle of the anode electrode 105 is asymmetrical in the right and left direction with respect to the electrode center in plan view.

As similar to the anode electrode structure of the second specific example, the anode electrode structure according to the third specific example is a pixel structure in which the anode electrode 105 does not exist on the non-light emitting unit side of the organic EL layer 107 and therefore the metal film 115 does not exist. Moreover, the step portion of the base insulating layer 104 does not exist and tungsten is not embedded. Accordingly, in the case of the anode electrode structure according to the third specific example, the light-collection effect by light reflection is lower than in the case of the second specific example.

Third Embodiment

A third embodiment is a modification of the first embodiment, and is an example of a case where the electrode surface of the anode electrode 105 has a stepped shape. That is, in the third embodiment, the step portion of the stepped shape of the base insulating layer 104 is not embedded with a metal material (for example, tungsten), the smoothing due to the embedding is not used, and the shape of the electrode surface of the anode electrode 105 is a stepped shape of the base insulating layer 104. The pixel structure in which the electrode surface of the anode electrode 105 has a stepped shape has an advantage that the optical scattering effect can be increased.

The pixel structure in which the electrode surface of the anode electrode 105 has a stepped shape can be applied to a pixel structure in which the inclination angle of the anode electrode 105 is symmetrical with respect to the electrode center in plan view, and can also be applied to a pixel structure in which the inclination angle is asymmetrical. Hereinafter, a specific example of the third embodiment will be described.

First Specific Example

Figure 13:
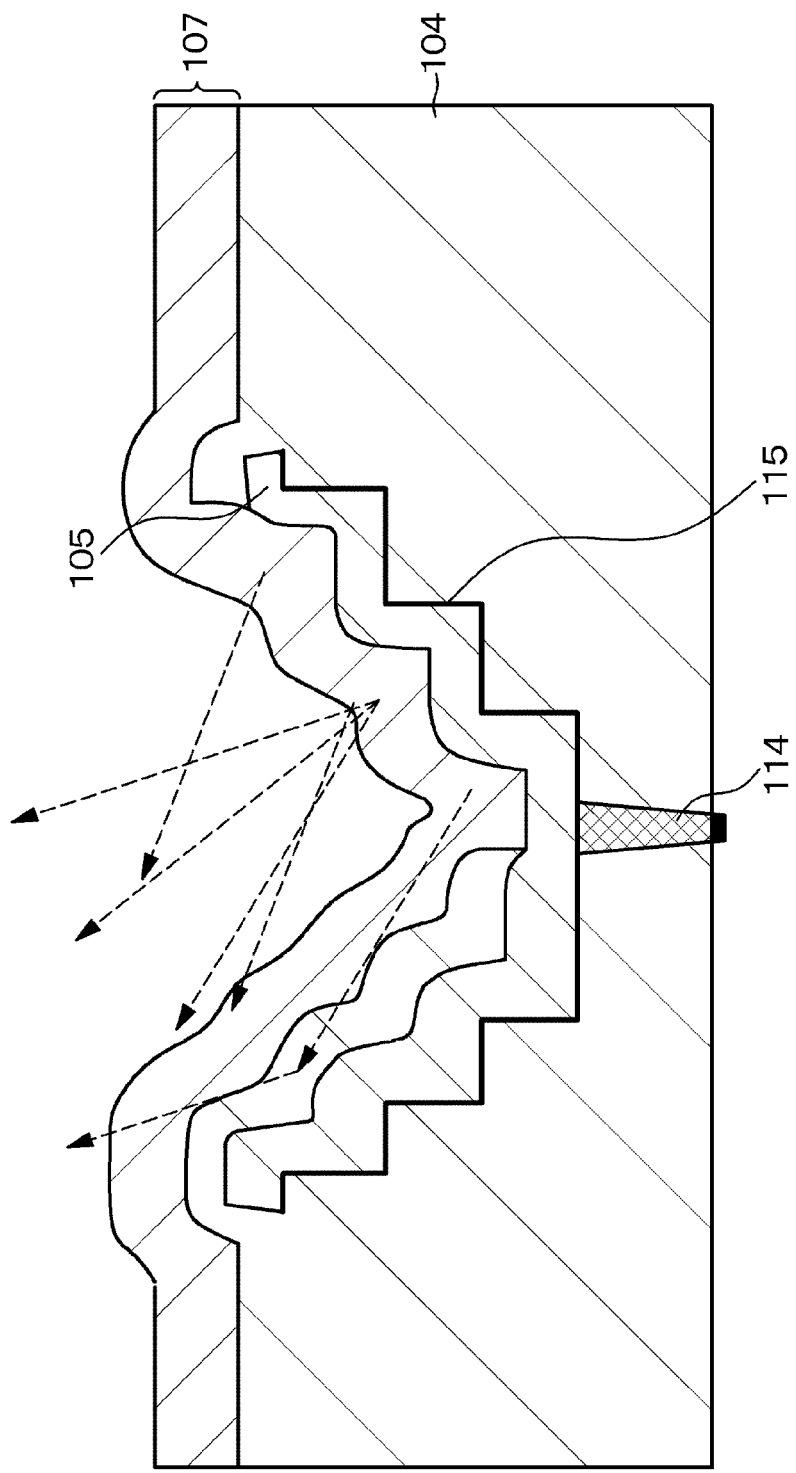
FIG. 13 is a cross-sectional view showing an anode electrode structure according to a first specific example of a third embodiment.

FIG. 13 shows a cross-sectional view of an anode electrode structure according to a first specific example of the third embodiment. The anode electrode structure according to the first specific example is a pixel structure in which the inclination angle of the anode electrode 105 is asymmetrical with respect to the electrode center in plan view. Then, a pixel structure is made in which there is no embedding of a step portion of the stepped shape of the base insulating layer 104 with a metal material, and a metal film 115 is formed on both the light emitting unit side and the non-light emitting unit side of the anode electrode 105.

Furthermore, the anode electrode structure according to the first specific example has a pixel structure in which a part of the base insulating layer 104 is interposed between the anode electrode 105 and the organic EL layer 107 on the non-light emitting unit side. According to the anode electrode structure of the first specific example, due to the presence of the metal film 115, it is possible to obtain a light-collecting effect by light reflection on the metal film 115 on the non-light emitting unit side. Furthermore, the metal material of the metal film 115 makes it possible to adjust the light-collecting effect.

Second Specific Example

Figure 14:
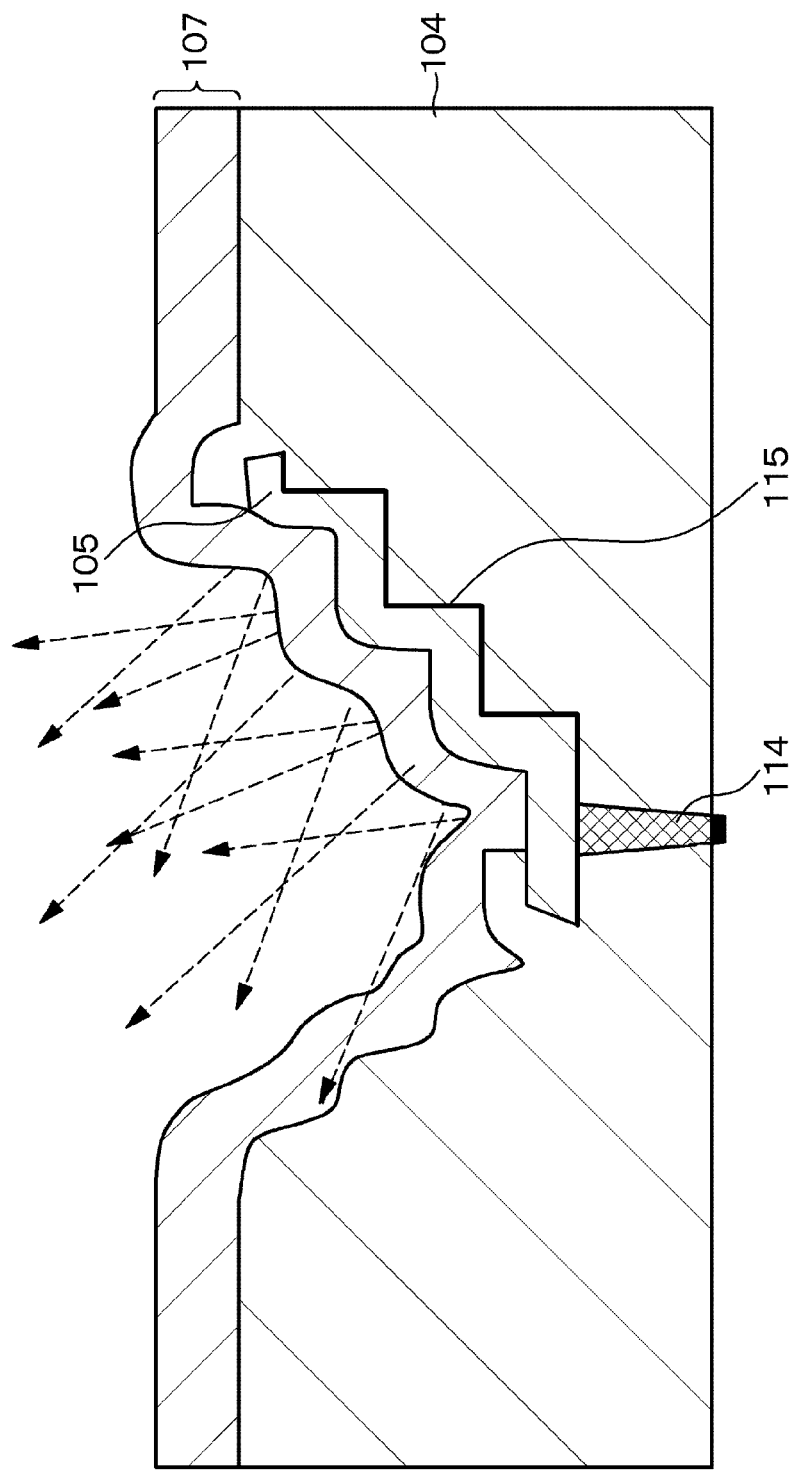
FIG. 14 is a cross-sectional view showing an anode electrode structure according to a second specific example of the third embodiment.

FIG. 14 shows a cross-sectional view of an anode electrode structure according to a second specific example of the third embodiment. The anode electrode structure of the second specific example has a pixel structure in which the anode electrode 105 does not exist on the non-light emitting unit side and therefore the metal film 115 does not exist. The anode electrode structure according to the second specific example has a pixel structure capable of intentionally generating scattered light.

Third Specific Example

Figure 15:
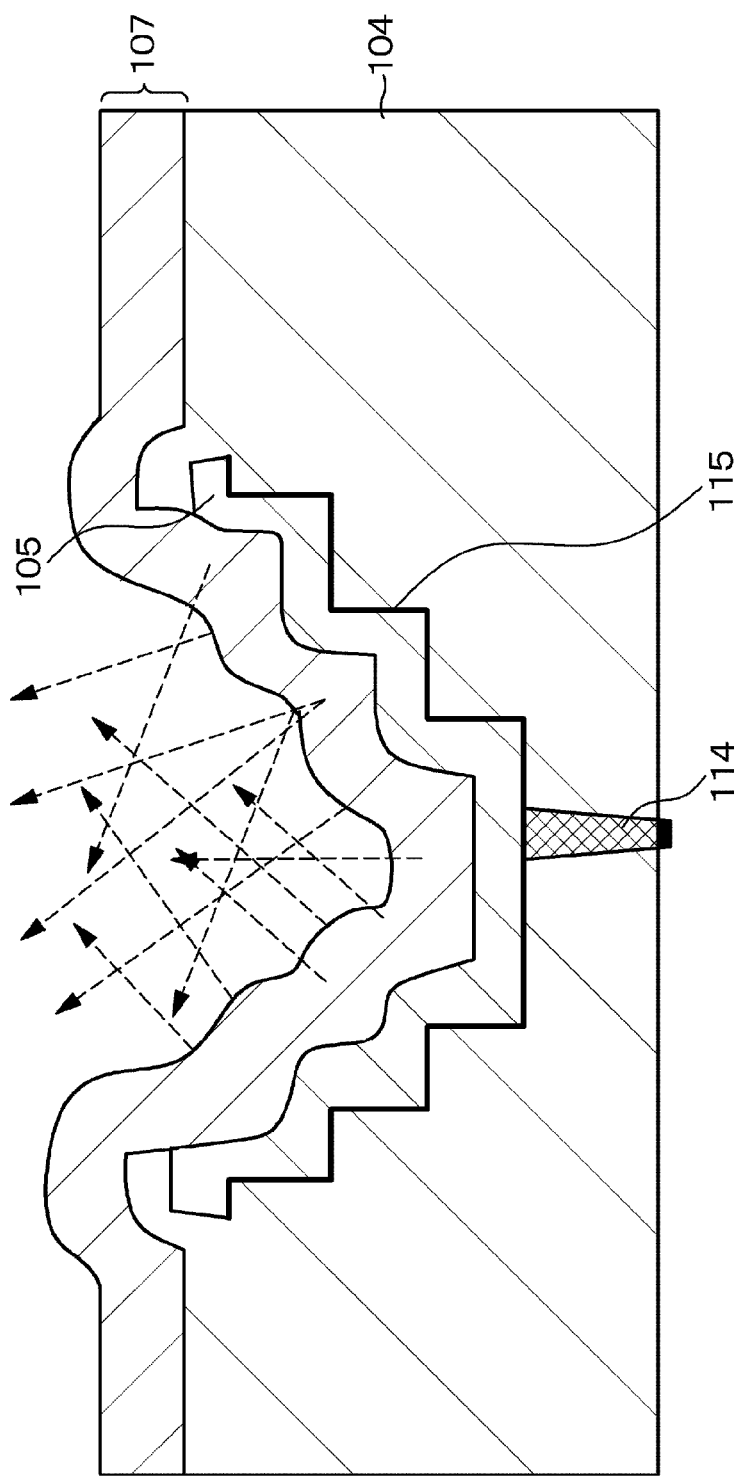
FIG. 15 is a cross-sectional view showing an anode electrode structure according to a third specific example of the third embodiment.

FIG. 15 shows a cross-sectional view of an anode electrode structure according to a third specific example of the third embodiment. The anode electrode structure according to the third specific example is, as similar to the anode electrode structure according to the first specific example, a pixel structure in which the inclination angle of the anode electrode 105 is asymmetrical with respect to the electrode center in plan view. Then, a pixel structure is made in which there is no embedding of a step portion of the stepped shape of the base insulating layer 104 with a metal material, and a metal film 115 is formed on both the light emitting unit side and the non-light emitting unit side of the anode electrode 105.

However, the anode electrode structure according to the third specific example is different from the anode electrode structure according to the first specific example in that a part of the base insulating layer 104 is not interposed between the anode electrode 105 and the organic EL layer 107 on the non-light emitting unit side. According to the anode electrode structure according to the third specific example, it is possible to intentionally generate scattered light and to obtain a light-collecting effect by light reflection on the metal film 115.

Fourth Specific Example

Figure 16:
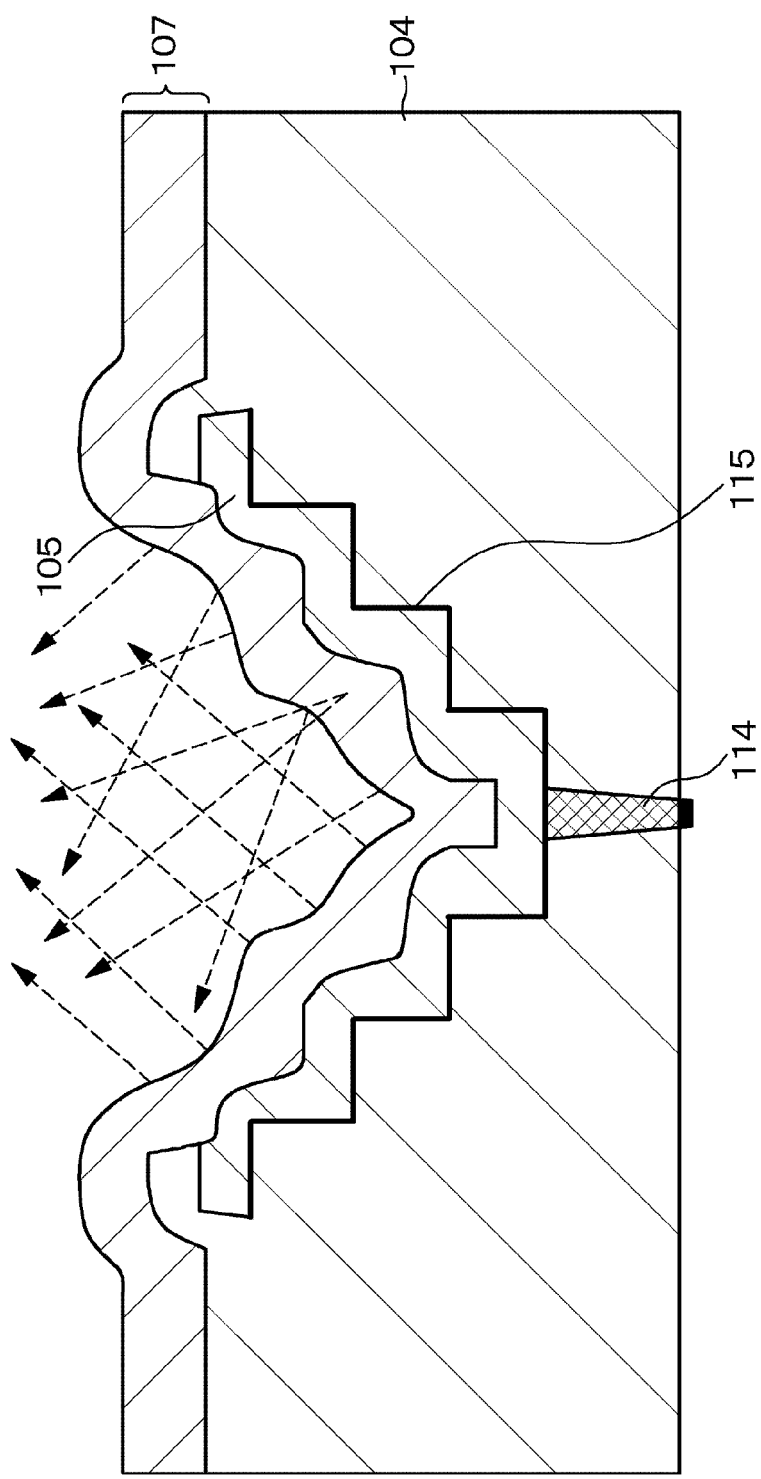
FIG. 16 is a cross-sectional view showing an anode electrode structure according to a fourth specific example of the third embodiment.

FIG. 16 shows a cross-sectional view of an anode electrode structure according to a fourth specific example of the third embodiment. The anode electrode structure according to the fourth specific example is a pixel structure in which the inclination angle of the anode electrode 105 is symmetrical with respect to the electrode center in plan view. Then, the anode electrode structure according to the fourth specific example is basically a pixel structure similar to the anode electrode structure according to the third specific example. Accordingly, according to the anode electrode structure of the fourth specific example, it is possible to intentionally obtain the scattering effect and the light-collecting effect, similarly to the anode electrode structure of the third specific example.

Fourth Embodiment

Figure 17:
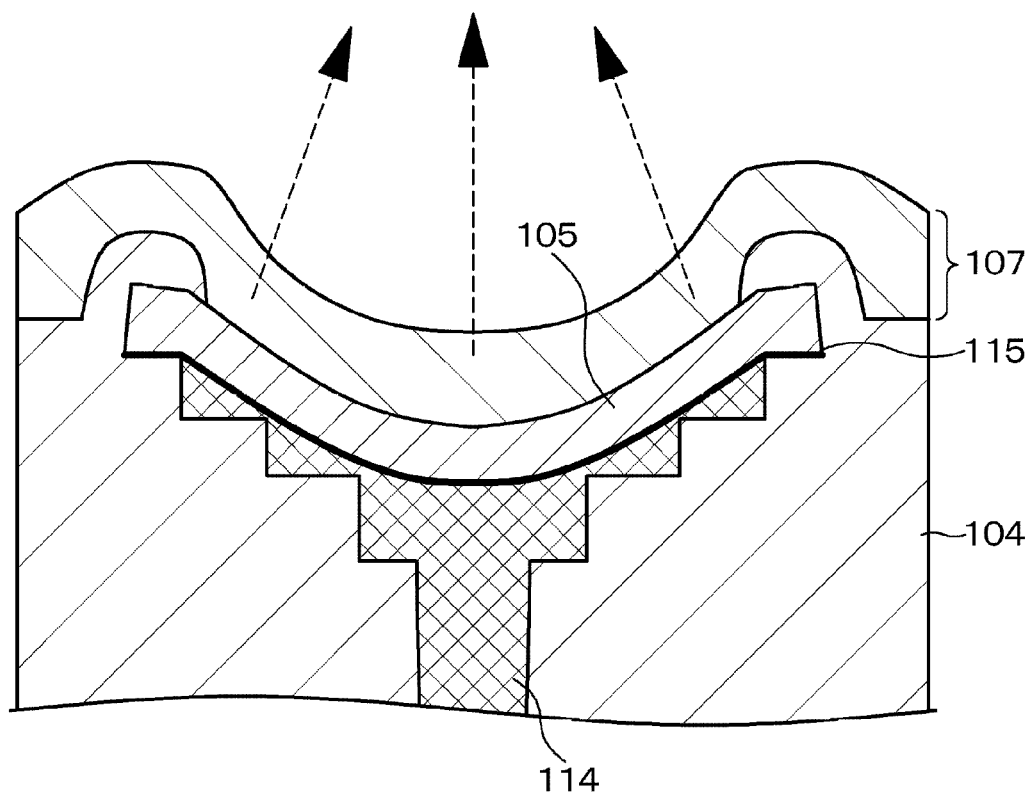
FIG. 17 is a cross-sectional view showing an anode electrode structure according to a fourth embodiment.

A fourth embodiment is a modification of the first embodiment, and is an example where the electrode surface of the anode electrode 105 has a reflector effect. FIG. 17 shows a cross-sectional view of an anode electrode structure according to the fourth embodiment.

The anode electrode structure according to fourth embodiment has a pixel structure in which the electrode surface of the anode electrode 105 has a reflector effect, for example, a pixel structure having a so-called bowl shape in which the cross section is curved in all directions with respect to the electrode center in plan view. The electrode surface shape having the reflector effect can be formed by adjusting the depth (height) of the step, the number of steps, the step width, and the like of the stepped shape of the base insulating layer 104.

According to the anode electrode structure according to the fourth embodiment, since the electrode surface of the anode electrode 105 has a reflector effect, the light-collecting effect can be enhanced.

Fifth Embodiment

Figure 18:
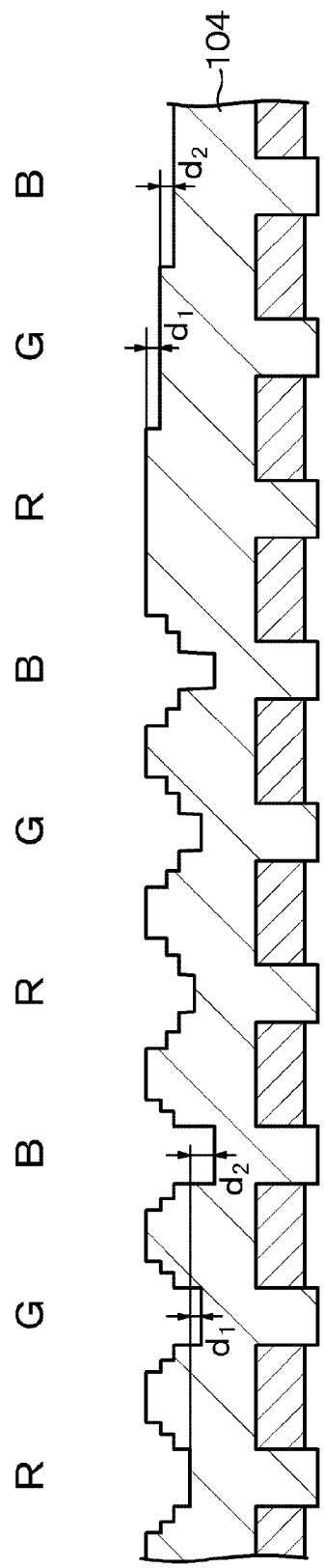
FIG. 18 is a cross-sectional view showing an anode electrode structure according to a fifth embodiment.

A fifth embodiment is a modification of the first embodiment, and is an example corresponding to a cavity (resonator) structure that utilizes the resonance effect of light between the cathode electrode and the anode electrode. FIG. 18 shows a cross-sectional view of an anode electrode structure according to the fifth embodiment.

In the organic EL display device 10 for color display in which one pixel, which is a unit for forming a color image, includes subpixels of a plurality of colors, a cavity structure is adopted in some cases in order to improve color purity and contrast. In the cavity structure, the light wavelengths of a plurality of colors, for example, the three primary colors of red (R), green (G), and blue (B) are different, so that the optical path length between the cathode electrode and the anode electrode matches the EL spectrum peak wavelength of each color, and the film thickness of the organic EL layer 107 is changed so as to extract the strongest light from each color.

In order to correspond to the cavity structure, the anode electrode structure according to the fifth embodiment has a structure in which, in addition to forming the electrode surface of the anode electrode 105 at an inclination angle according to the stepped shape of the base insulating layer 104, a step is provided for each color pixel (subpixel) on the base insulating layer 104 on which the anode electrode 105 is formed (hereinafter, referred to as "anode formation surface"). Specifically, since the relationship between the RGB wavelengths is R>G>B, the anode formation surface of the R pixel having the longest wavelength is set as a reference, the anode formation surface of the G pixel is deepened by a depth $d_1$, and the anode formation surface of the B pixel is deepened by the depth $d_2$, so that a step is formed on the anode formation surface for each color pixel.

As described above, the anode electrode structure according to the fifth embodiment in which the step is formed on the anode formation surface for each color pixel can also correspond to a cavity structure that utilizes the resonance effect of light between the cathode electrode and the anode electrode in order to improve color purity and contrast. Formation of a step for each color pixel on the anode formation surface can be achieved by the following two steps.

Step 1

Figure 19A:
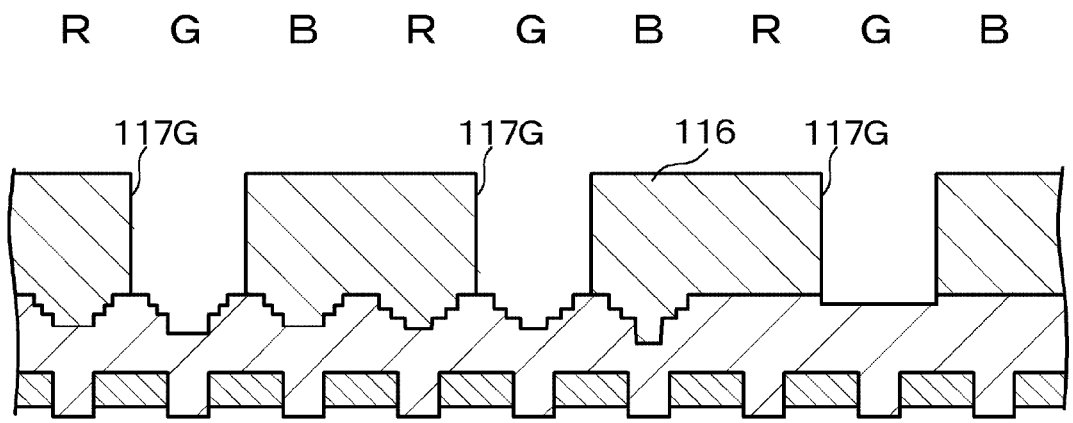
FIGS. 19A and 19B are diagrams for explaining a procedure of forming a step on an anode formation surface for each pixel of each color in the anode electrode structure according to the fifth embodiment.

First, as shown in FIG. 19A, an opening 117G corresponding to the G pixel is patterned in a resist 116, and the anode formation surface of the G pixel is cut by a depth $d_1$ with reference to the anode formation surface of the R pixel by dry etching. The cutting depth $d_1$ can be adjusted by the dry etching amount. The anode formation surface of the G pixel can be formed before or after processing the stepped shape of the base insulating layer 104.

Step 2

Figure 19B:
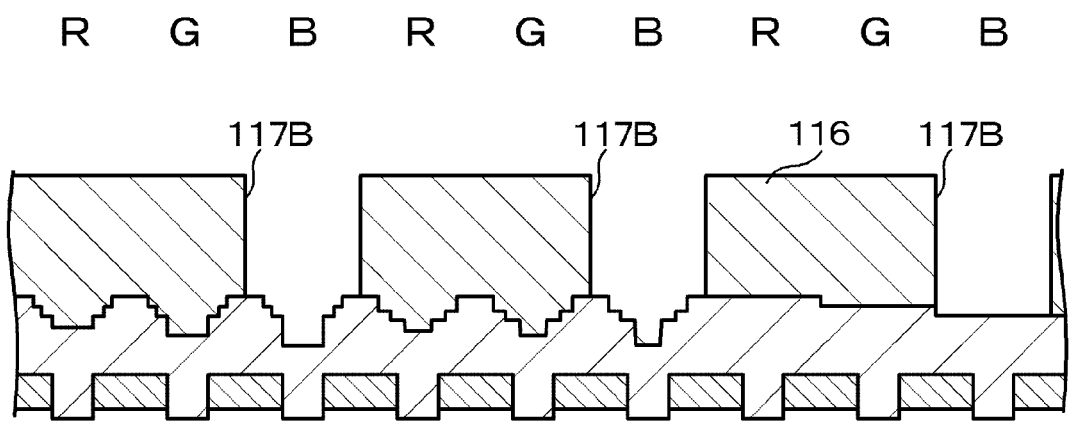

Next, as shown in FIG. 19B, the opening 117B corresponding to the B pixel is patterned in the resist 116, and the anode formation surface of the B pixel is cut by the depth $d_2$ with reference to the anode formation surface of the R pixel by dry etching. The cutting depth $d_2$ can be adjusted by the dry etching amount. The anode formation surface of the B pixel can be formed before or after processing the stepped shape of the base insulating layer 104.

The region where the stepped shape is not formed in the base insulating layer 104 (that is, the region A in FIG. 5) can be formed simultaneously in step 1 and step 2. In this case, the digging amount of the region A is the same amount as the region where the stepped shape is formed in the base insulating layer 104 (that is, the region B and the region C of FIG. 5), that is, the depth $d_1$ and the depth $d_2$. Furthermore, the digging amount in the region A can be adjusted by processing the region A in a process different from steps 1 and 2.

Sixth Embodiment

A sixth embodiment is a modification of the first embodiment, and is another example of processing the stepped shape of the base insulating layer 104 of the anode electrode 105.

In the first embodiment, in any of the first specific example of FIG. 6 to the fourth specific example of FIG. 9 showing the stepped shape of the base insulating layer 104, the side surface of each step of the stepped shape is formed perpendicularly to the substrate surface. On the other hand, in the sixth embodiment, another processing method is adopted for the stepped shape of the base insulating layer 104. Hereinafter, another processing example 1 and processing example 2 of a stepped shape of a base insulating layer 104 according to the fifth embodiment will be described.

Other Processing Example 1

Figure 20A:
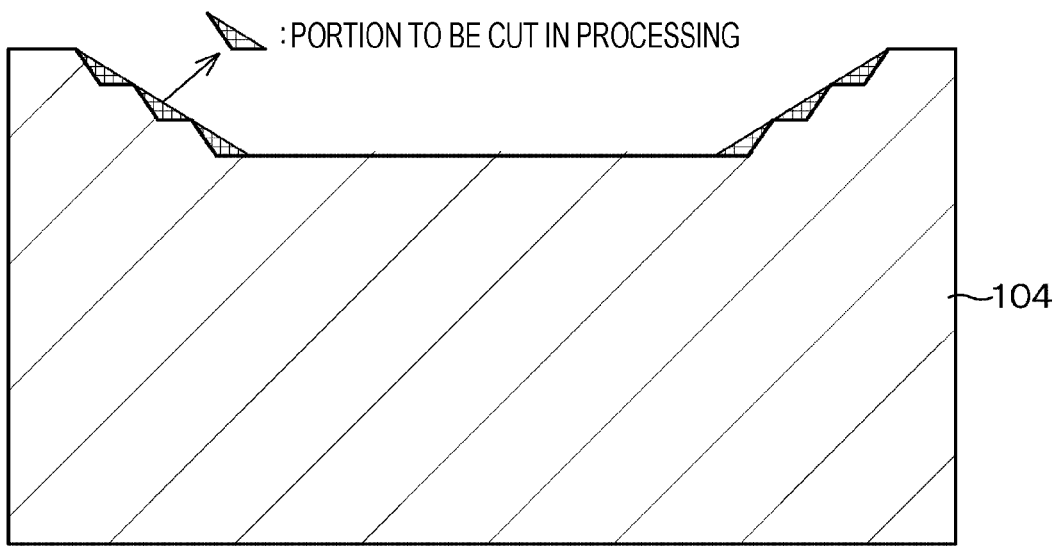
FIGS. 20A and 20B are diagrams for explaining another processing example 1 and processing example 2 of a stepped shape of a base insulating layer according to a sixth embodiment.

FIG. 20A shows the other processing example 1 of the stepped shape of the base insulating layer 104 according to the fifth embodiment. The other processing example 1 is a processing example in which the side surface (processed surface) of each step is tapered by a known dry etching technology when processing the base insulating layer 104 having a stepped surface shape. According to the other processing example 1, the stepped shape of the base insulating layer 104 can have an inclined surface immediately after processing, in other words, can have an inclined surface corresponding to the taper angle of the side surface. As a result, the surface shape of the base insulating layer 104 can be made into a stepped shape having an inclined surface in advance.

Other Processing Example 2

Figure 20B:
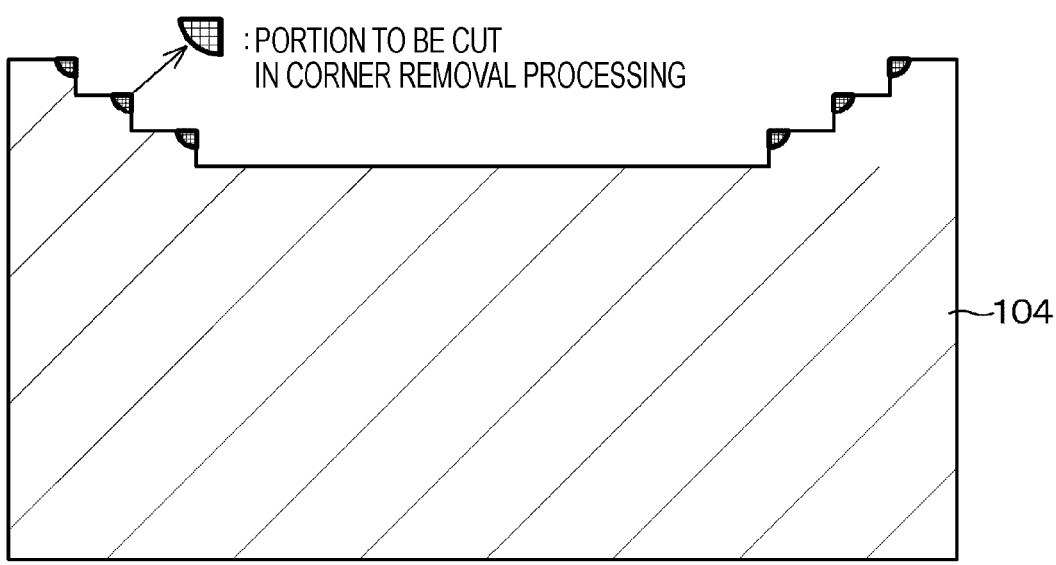

FIG. 20B shows the other processing example 2 of the stepped shape of the base insulating layer 104 according to the fifth embodiment. In the other processing example 2, when processing the base insulating layer 104 having a stepped surface shape, the side surface of the step is processed perpendicularly to the substrate surface, and the formed processed shape having a corner portion is subjected to the processing of removing a corner such as a reverse sputtering processing. According to the other processing example 2, the surface shape (stepped shape) of the base insulating layer 104 can be a shape that improves the coating property of the anode electrode 105.

Seventh Embodiment

A seventh embodiment is a modification of the first embodiment, and is a design example for the inclination angle of the anode electrode 105. The inclination angle of the anode electrode 105 can be arbitrarily set for each pixel (each subpixel). A specific example of the design of the inclination angle of the anode electrode 105 will be described below.

First Specific Example

Figure 21A:
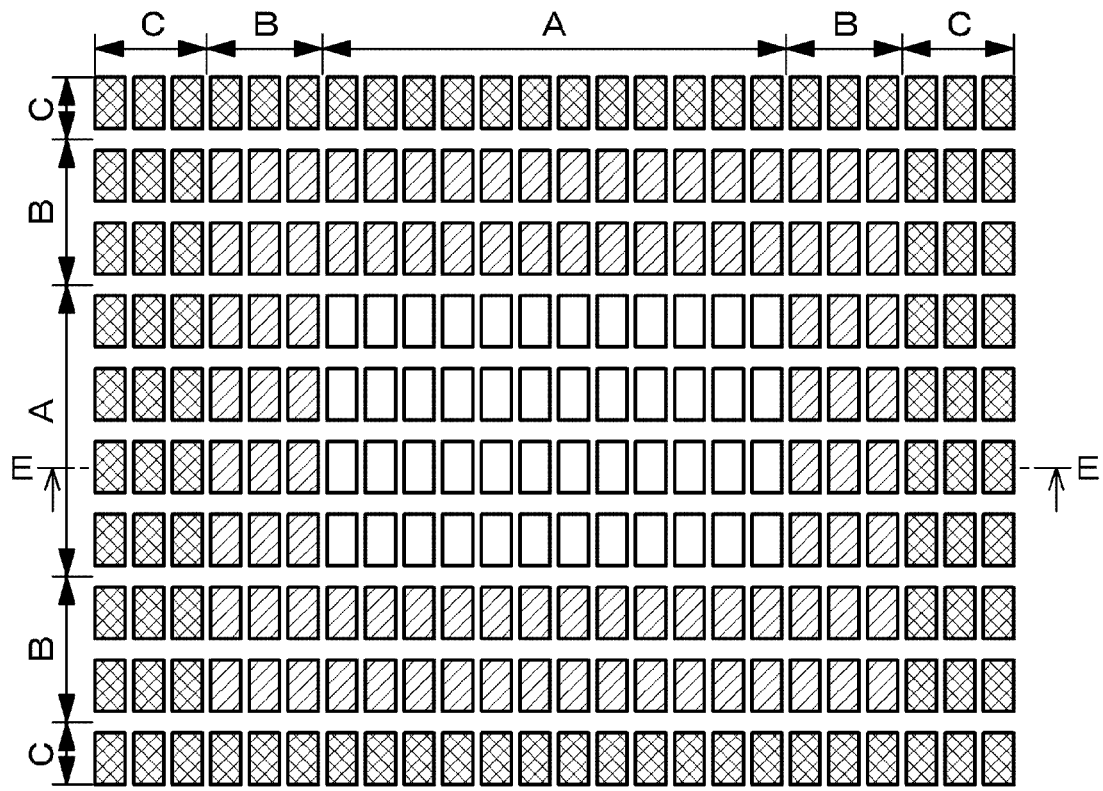
FIG. 21A is an electrode plan view for a design of an inclination angle according to a first specific example according to a seventh embodiment.
Figure 21B:
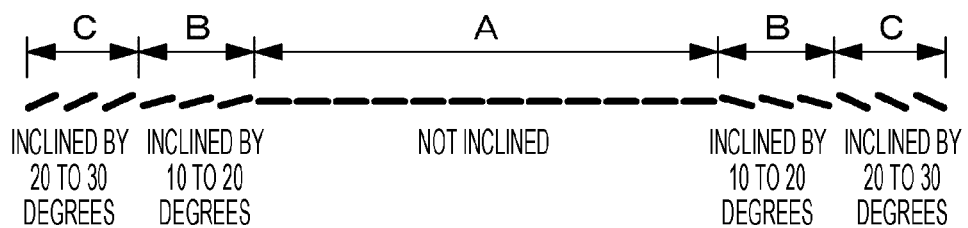
FIG. 21B is a cross-sectional view of an electrode taken along line E-E of FIG. 21A.

FIG. 21A shows an electrode plan view for a design of an inclination angle according to a first specific example, and FIG. 21B shows a cross-sectional view of an electrode taken along line E-E of FIG. 21A. The design of the inclination angle according to the first specific example corresponds to the stepped shape (see FIG. 5) of the base insulating layer 104 shown in the first embodiment. That is, in the region A at the central portion of the pixel region, the electrode surface of the anode electrode 105 is a surface parallel to the substrate surface, that is, a surface without inclination.

Furthermore, the electrode surface of the anode electrode 105 is an inclined surface facing outward in the right and left direction (first direction/row direction) of the pixel region in the regions B and C, is an inclined surface of, for example, about 10 to 20 degrees in the region B, and is an inclined surface of, for example, about 20 to 30 degrees in the region C. The number of rows and the number of columns of pixels defining each of the regions A, B, and C can be set arbitrarily.

The setting of each of the regions A, B, and C is preferably concentric, but is not limited to being concentric. This is similar in the specific examples as described later.

The design of the inclination angle of the anode electrode 105 according to the second to fourth specific examples described below is a design that matches the optical axis design of the lens. The lens referred to here is the lens (lens group) 80 shown in FIG. 4, which is used in combination with the microdisplay.

Second Specific Example

Figure 22A:
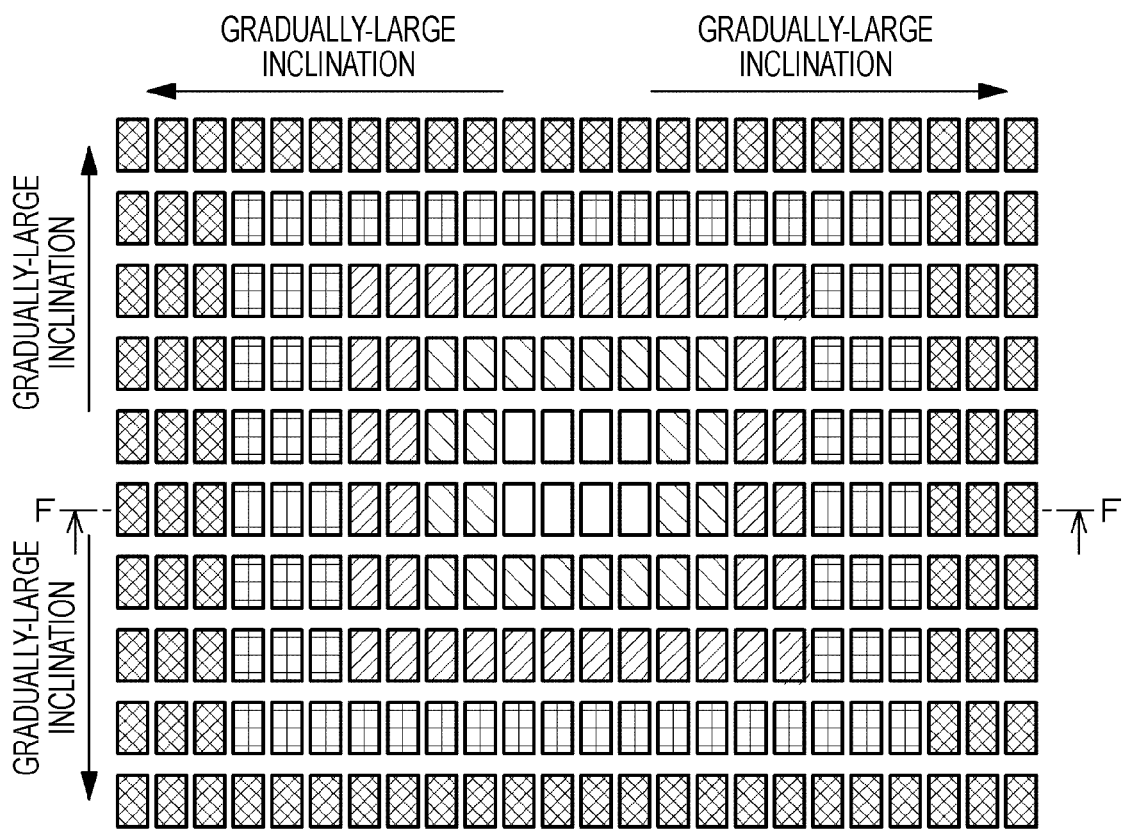
FIG. 22A is an electrode plan view for a design of an inclination angle according to a second specific example of the seventh embodiment.
Figure 22B:
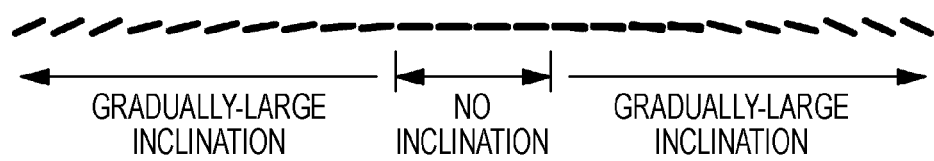
FIG. 22B is a cross-sectional view of an electrode taken along line F-F of FIG. 22A.

FIG. 22A shows an electrode plan view for a design of an inclination angle according to a second specific example, and FIG. 22B shows a cross-sectional view of an electrode taken along line F-F of FIG. 22A. In the second specific example, the electrode surface of the anode electrode 105 is designed such that there is no inclination in the central portion of the pixel region, and the angle of the inclined surface that faces outward in the right and left direction of the pixel region gradually increases minutely toward the peripheral edge portion in units of region in accordance with the optical axis design of the lens. That is, the design of the inclination angle according to the second specific example is a design of a configuration in which the electrode surface of the anode electrode 105 faces outward and is inclined in multiple stages in units of region.

Third Specific Example

Figure 23A:
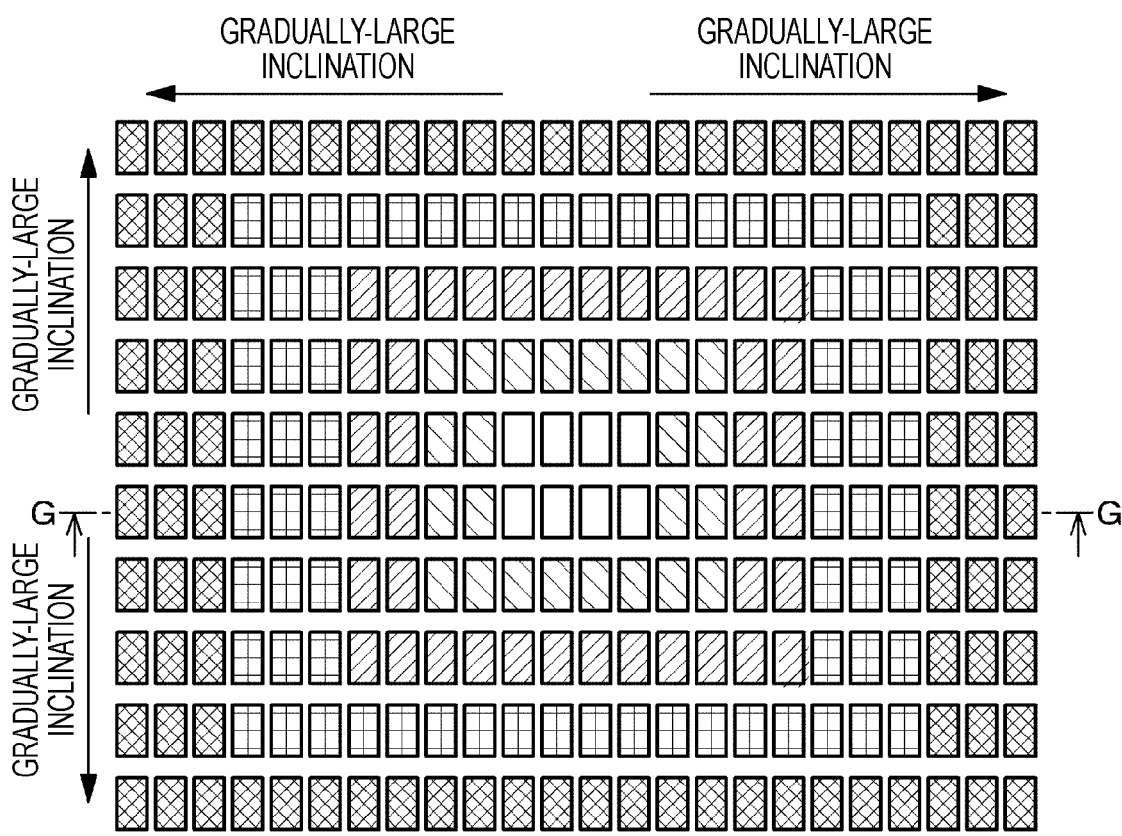
FIG. 23A is an electrode plan view for a design of an inclination angle according to a third specific example of the seventh embodiment.
Figure 23B:
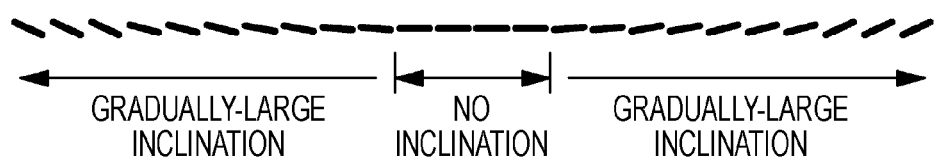
FIG. 23B is a cross-sectional view of an electrode taken along line G-G of FIG. 23A.

FIG. 23A shows an electrode plan view of an electrode for a design of an inclination angle according to a third specific example, and FIG. 23B shows a cross-sectional view of an electrode taken along line G-G of FIG. 23A. In the third specific example, the electrode surface of the anode electrode 105 is designed such that there is no inclination in the central portion of the pixel region, and the angle of the inclined surface that faces inward in the right and left direction of the pixel region gradually increases minutely (for example, in units of region) toward the peripheral edge portion in accordance with the optical axis design of the lens. That is, the design of the inclination angle according to the third specific example is a design of a configuration in which the electrode surface of the anode electrode 105 faces inward and is inclined in multiple stages in units of region.

Fourth Specific Example

Figure 24A:
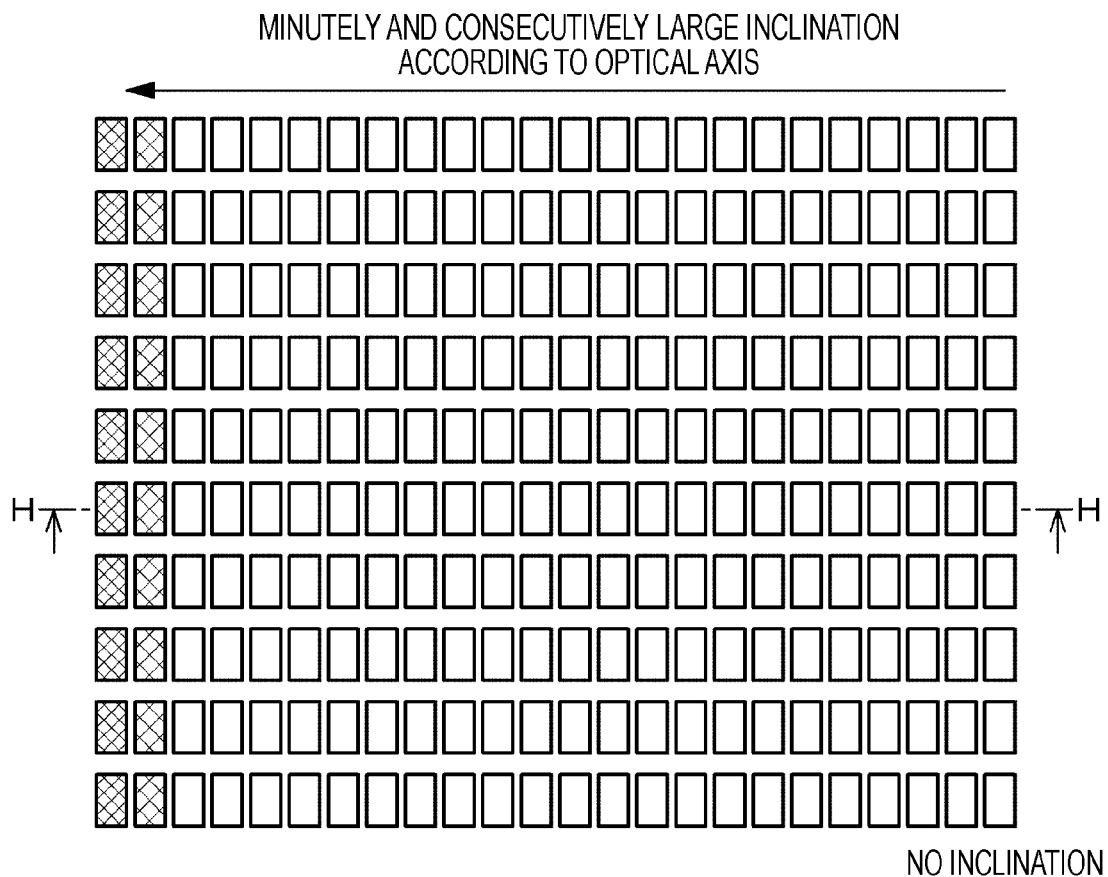
FIG. 24A is an electrode plan view for a design of an inclination angle according to a fourth specific example of the seventh embodiment.
Figure 24B:
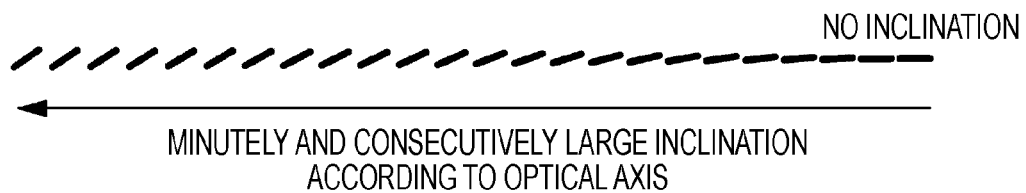
FIG. 24B is a cross-sectional view of an electrode taken along the line H-H of FIG. 24A.

FIG. 24A shows an electrode plan view for a design of an inclination angle according to a fourth specific example, and FIG. 24B shows a cross-sectional view of an electrode taken along the line H-H of FIG. 24A. In the fourth specific example, the electrode surface of the anode electrode 105 on the one side in the right and left direction of the pixel region is not inclined, and the electrode surface of the anode electrode 105 on the other side has the maximum inclination angle. Then, the fourth specific example is designed such that the angle of the inclined surface facing outward increases from the one side of the pixel region toward the other side, minutely (for example, in a pixel row unit or a plurality of pixel row units) and continuously in accordance with the optical axis design of the lens.

That is, the design of the inclination angle according to the fourth specific example is a design of a configuration in which the electrode surface of the anode electrode 105 faces outward and is minutely and continuously inclined in one direction in the right and left direction of the pixel region. Note that, in the design of the inclination angle according to the fourth specific example, the electrode surface of the anode electrode 105 faces outward, but it may face inward.

Eighth Embodiment

An eighth embodiment is an example of a manufacturing method of the organic EL display device 10 according to the present embodiment. In the manufacturing method according to the present embodiment, in manufacturing the organic EL display device 10 having the pixel region (pixel array unit 30) in which the pixel 20 including the organic EL element 21 is arranged on the substrate 101, a region where the anode electrode 105 of the organic EL element 21 includes a pixel inclined with respect to the substrate surface is provided in the pixel region. Then, the electrode surface of the anode electrode 105 is formed at an inclination angle according to the surface shape of the base insulating layer 104.

Figure 25:
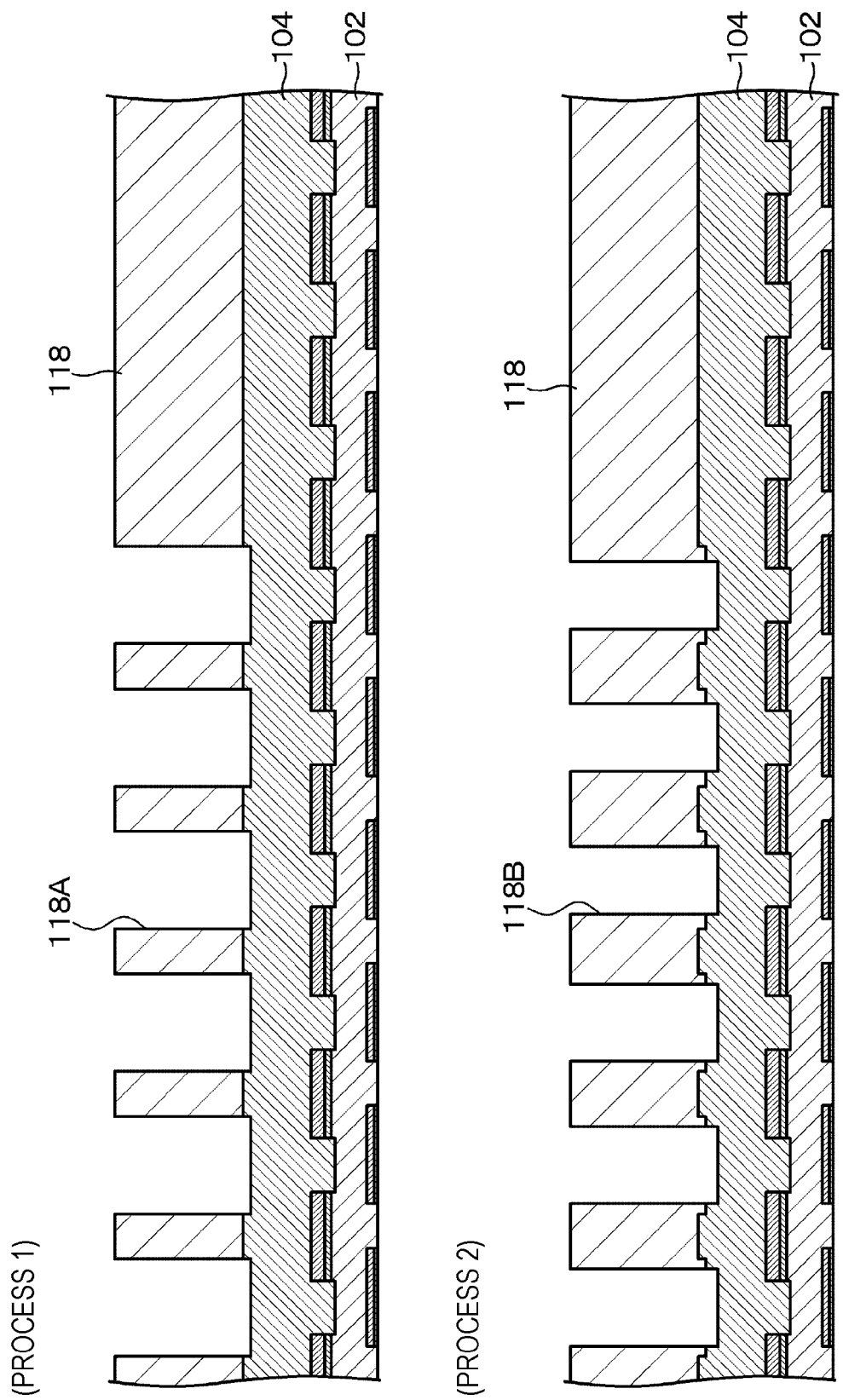
FIG. 25 is a process diagram (1) showing a process of forming a base insulating layer and an anode electrode according to an eighth embodiment.
Figure 26:
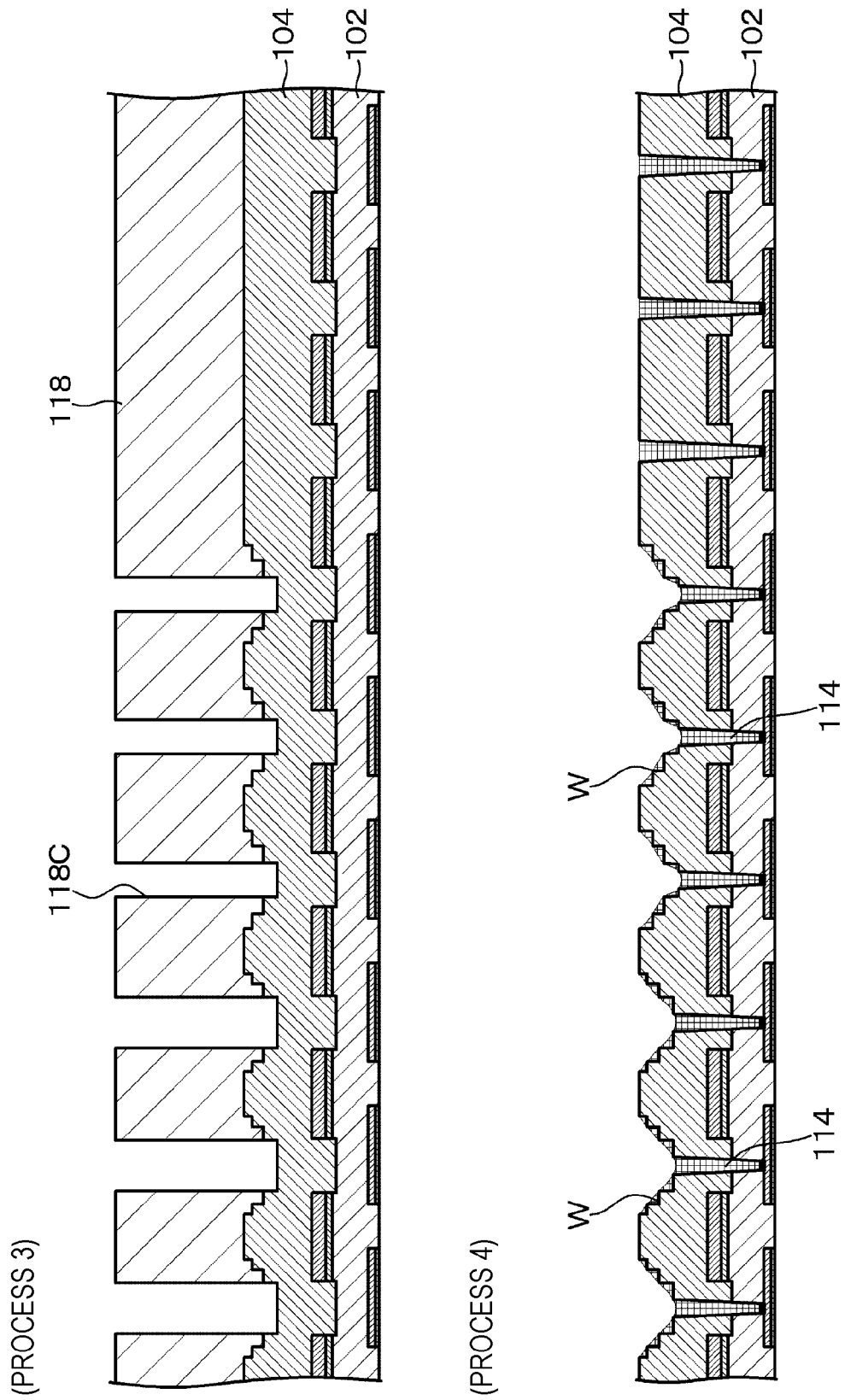
FIG. 26 is a process diagram (2) showing a process of forming a base insulating layer and an anode electrode according to the eighth embodiment.
Figure 27:
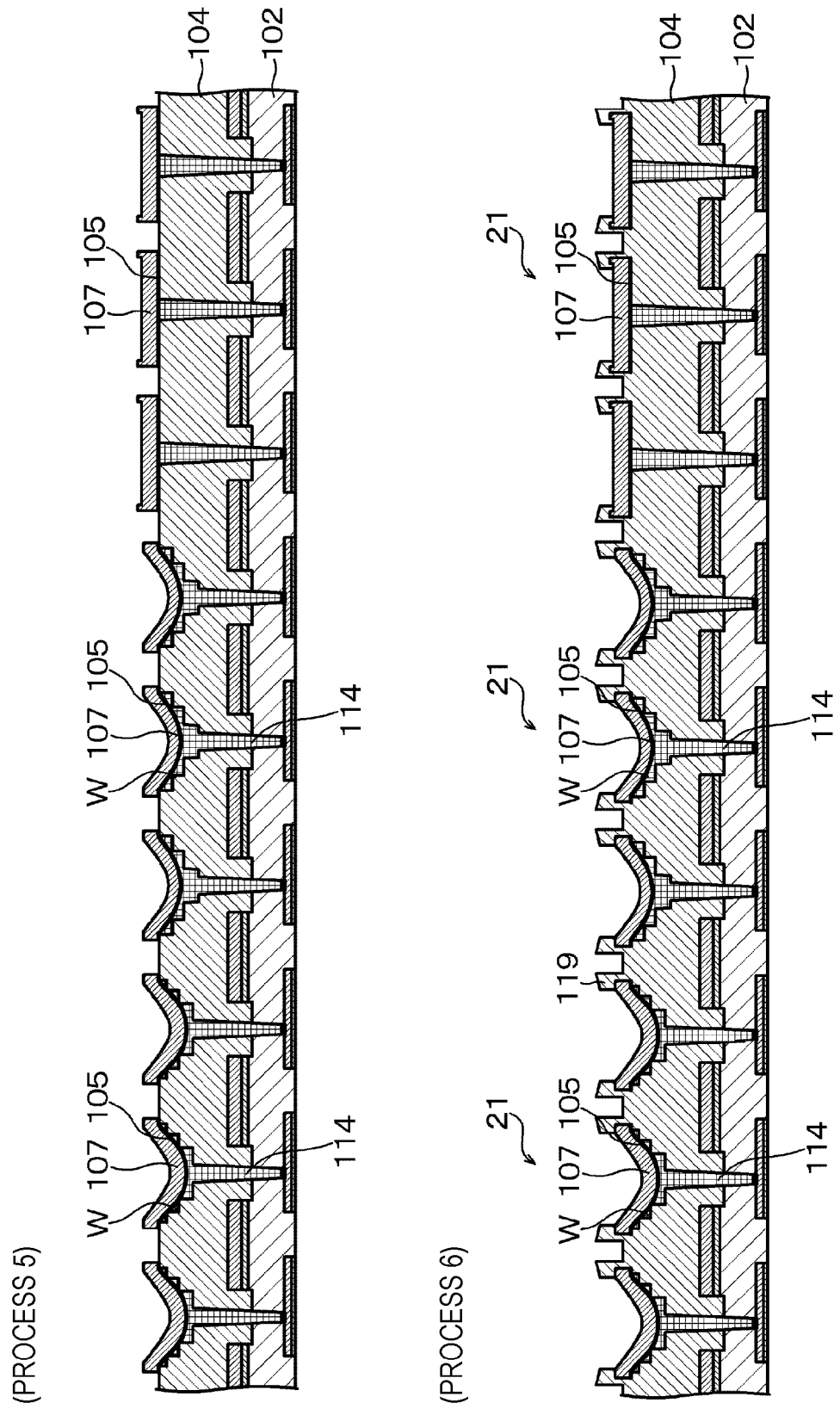
FIG. 27 is a process diagram (3) showing a process of forming a base insulating layer and an anode electrode according to the eighth embodiment.

Hereinafter, the manufacturing process of the main portion of the organic EL display device 10 according to the present embodiment, in particular, the process of forming the base insulating layer 104 and the anode electrode 105 will be described using the process diagrams of FIGS. 25, 26, and 27. Hereinafter, the process after the circuit element of the pixel 20 is formed, the base insulating layer 104 is layered on the circuit element, and the upper surface of the base insulating layer 104 is flattened will be described. Furthermore, here, as the stepped shape of the base insulating layer 104, the case of three steps shown in FIG. 5 will be described as an example.

The first processed step is formed on the flattened base insulating layer 104 by using a lithography mask 118 having a design value of the step layout position in the up, down, right, and left and the step width designed in advance in the inside and outside of the pixel region, and performing a dry etching process through an opening pattern 118A corresponding to the first step of the stepped shape (process 1). Next, the second processed step is formed by a dry etching process through an opening pattern 118B designed corresponding to the second step of the stepped shape with respect to the first processed step (process 2). Moreover, the third processed step is formed by a dry etching process through an opening pattern 118C designed corresponding to the third step of the stepped shape with respect to the second processed step (process 3).

In the example described above, for the stepped shape, the steps are processed in the order of the first step, the second step, and the third step, but the order is not limited to this order, and the steps may be processed in the order of third step, the second step, and the first step. Furthermore, the depth (height) of each step can be adjusted by the cutting amount in the dry etching process. Note that, in a case where the number of steps in the stepped shape is four or more, the above-described forming process of processed steps is repeated according to the design value of the steps.

After forming the stepped shape, a metal material such as tungsten (W) is embedded to form the contact unit 114 through various processes (process 4). By embedding tungsten (W), the stepped shape of the base insulating layer 104 is smoothed, and then finishing by, for example, chemical mechanical polishing (CMP) is performed. Thereafter, the anode electrode 105 is formed on the smoothed stepped shape of the base insulating layer 104, and the organic EL layer 107 is formed thereon (process 5). Then, the insulating film 119 is entirely formed, and then the opening 119A is formed on the anode electrode 105 with respect to the insulating film 119 (process 6).

Figure 28:
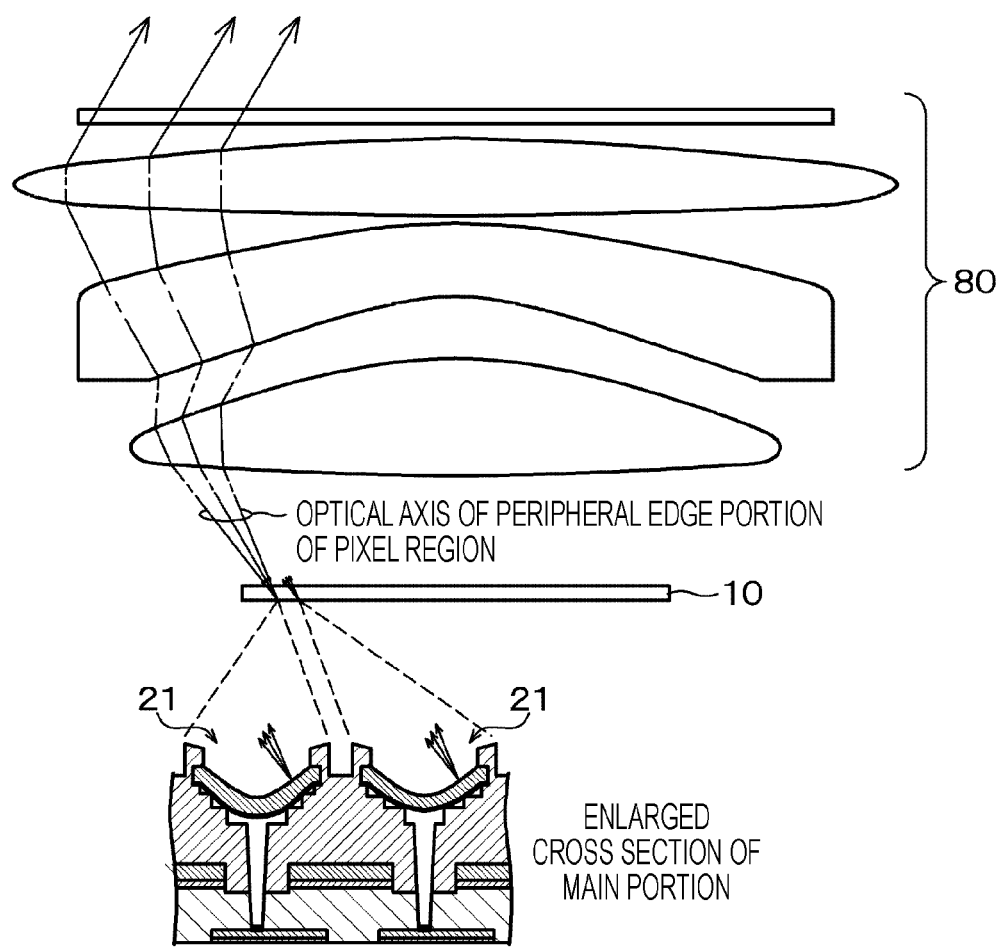
FIG. 28 is a diagram for explaining that a high viewing angle characteristic can be secured by an anode electrode structure according to the present embodiment.

By each of the processing processes including process 1 to process 6 described above, for example, it is possible to manufacture an anode electrode structure including the base insulating layer 104 having a stepped surface shape shown in FIG. 5, and the anode electrode 105 of an inclination angle according to the surface shape of the base insulating layer 104. Then, as a result, the inclination angle of the anode electrode 105 with respect to the substrate surface can be freely set for each pixel according to the surface shape of the base insulating layer 104, and thus a high viewing angle characteristic can be secured. In particular, as shown in FIG. 28, it is possible to design the microdisplay used in combination with the lens 80 in accordance with the light taking-in optical axis of the lens 80, and thus it is possible to secure high viewing angle characteristic.

<Electronic Device of the Present Disclosure>

The display device according to the present disclosure described above can be used as a display unit (display device) of an electronic device in any fields that displays a video signal input to an electronic device or a video signal generated in the electronic device as an image or video. Examples of the electronic device can include a television set, a notebook personal computer, a digital still camera, a mobile terminal device such as a mobile phone, a head mounted display, and the like. However, the electronic device is not limited to these.

As described above, the following effects can be obtained by using the display device of the present disclosure as a display unit in electronic devices of any fields. That is, according to the display device of the present disclosure, a high viewing angle characteristic can be secured. Accordingly, by using the display device of the present disclosure, a high viewing angle characteristic can be secured for the display unit of the electronic device. In particular, in a case where the display device of the present disclosure is a microdisplay used in combination with the lens 80, it is possible to design in accordance with the light taking-in optical axis of the lens, and thus it is possible to secure high viewing angle characteristic.

The display device of the present disclosure also includes a module shape of a sealed configuration. Examples of such a display device include a display module formed by affixing a facing unit such as transparent glass to a pixel array unit. Note that the display module may be provided with a circuit unit for inputting and outputting a signal or the like from the outside to the pixel array unit, a flexible printed circuit (FPC), or the like. Hereinafter, a digital still camera and a head mounted display will be exemplified as specific examples of the electronic device using the display device of the present disclosure. However, the specific examples illustrated here are merely examples, and the present invention is not limited thereto.

Specific Example 1

Figure 29A:
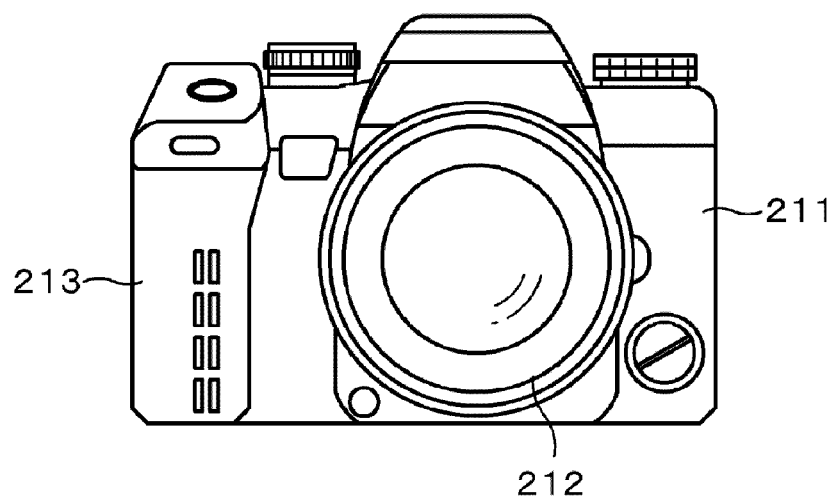
FIG. 29A is a front view of a lens interchangeable single-lens reflex type digital still camera according to a first specific example of an electronic device of the present disclosure.
Figure 29B:
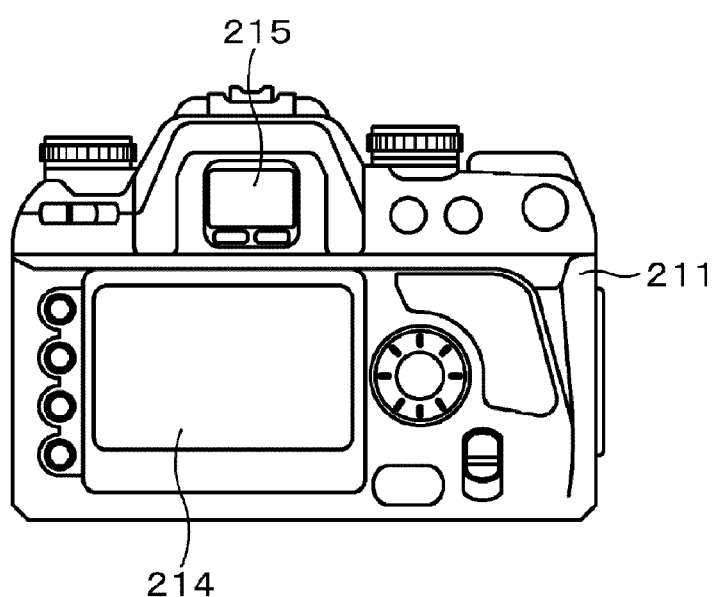
FIG. 29B is a rear view thereof.

FIG. 29 is an external view of a lens interchangeable single-lens reflex type digital still camera according to a first specific example of the electronic device of the present disclosure, FIG. 29A is a front view thereof and FIG. 29B is a rear view thereof.

The lens interchangeable single lens reflex type digital still camera according to the first specific example has, for example, an interchangeable photographic lens unit (interchangeable lens) 212 on the front right side of a camera body unit (camera body) 211, and a grip unit 213 that is gripped by a photographer on the front left side.

Then, a monitor 214 is provided substantially at the center of the rear surface of the camera body unit 211. An electronic view finder (eyepiece window) 215 is provided on the upper portion of the monitor 214. By looking into an electronic view finder 215, the photographer can visually recognize an optical image of a subject introduced from the photographing lens unit 212 and determine the composition.

In the lens interchangeable single lens reflex type digital still camera having the above configuration, the display device of the present disclosure can be used as the electronic view finder 215. In other words, the lens interchangeable single lens reflex type digital still camera according to the first specific example is manufactured by using the display device of the present disclosure as the electronic view finder 215.

Specific Example 2

Figure 30:
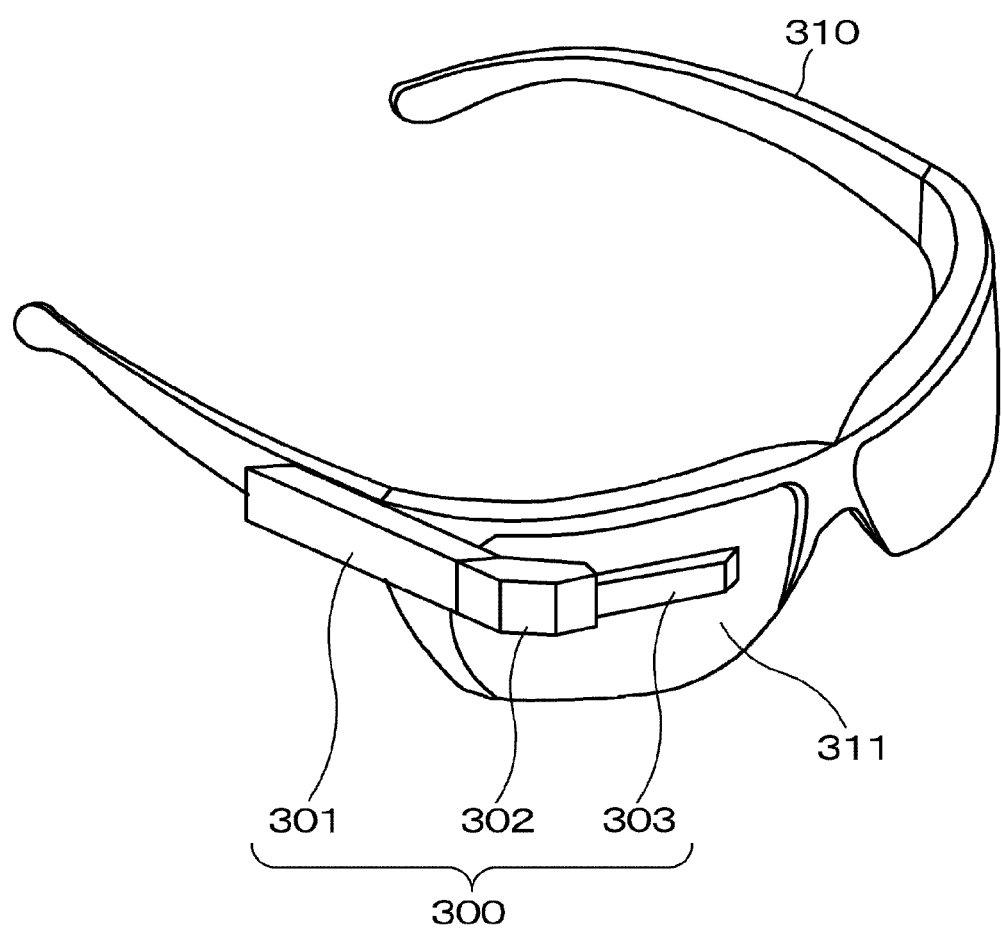
FIG. 30 is an external view showing an example of a head mounted display according to a second specific example of the electronic device of the present disclosure.

FIG. 30 is an external view showing an example of a head mounted display according to a second specific example of the electronic device of the present disclosure.

The head mounted display 300 according to the second specific example has a transmission type head mounted display configuration including a body unit 301, an arm unit 302, and a lens barrel 303. The body unit 301 is connected to the arm unit 302 and glasses 310. Specifically, an end portion in the long side direction of the body unit 301 is attached to the arm unit 302. Furthermore, one side of the side surface of the body unit 301 is coupled to the glasses 310 via a connecting member (not shown). Note that the body unit 301 may be directly mounted on the head of a human body.

The body unit 301 incorporates a control board and a display unit for controlling the operation of the head mounted display 300. The arm unit 302 couples the body unit 301 to the lens barrel 303 to support the lens barrel 303 with respect to the body unit 301. Specifically, the arm unit 302 is coupled to the end portion of the body unit 301 and the end portion of the lens barrel 303 to fix the lens barrel 303 with respect to the body unit 301. Furthermore, the arm unit 302 incorporates a signal line for communicating data related to an image provided from the body unit 301 to the lens barrel 303.

The lens barrel 303 projects image light provided from the body unit 301 via the arm unit 302 through the lens 311 of the glasses 310 toward the eyes of the user wearing the head mounted display 300.

In the head mounted display 300 having the configuration described above, the display device of the present disclosure can be used as a display unit incorporated in the body unit 301. In other words, the head mounted display 300 according to the second specific example is manufactured by using the display device of the present disclosure as the display unit.

<Configuration that the Present Disclosure can Have>

Note that, the present disclosure can also have the following configuration.

<<A. Display Device>>

[A-1] A display device including a pixel region including a pixel including a light emitting unit arranged on a substrate, in which the pixel region is provided with a region in which an anode electrode of the light emitting unit includes a pixel inclined with respect to a substrate surface, and an electrode surface of the anode electrode has an inclination angle according to a surface shape of a base insulating layer.

[A-2] The display device according to [A-1] described above, in which the surface shape of the base insulating layer is a stepped shape, and the anode electrode is formed on the stepped shape of the base insulating layer.

[A-3] The display device according to [A-2] described above, in which the inclination angle of the electrode surface of the anode electrode is determined by a depth of a step, a number of steps, and a step width of the stepped shape of the base insulating layer.

[A-4] The display device according to [A-2] described above, in which the stepped shape of the base insulating layer is embedded with a metal material and is smoothed, and the anode electrode is formed on a smoothed portion of the base insulating layer.

[A-5] The display device according to [A-4] described above, in which the inclination angle of the electrode surface of the anode electrode is symmetrical in a first direction and a second direction with respect to an electrode center in plan view.

[A-6] The display device according to [A-4] described above, in which the inclination angle of the electrode surface of the anode electrode is asymmetrical in a first direction with respect to an electrode center in plan view, and one side of the electrode surface of an asymmetrical shape is a non-light emitting unit side.

[A-7] The display device according to [A-6] described above, in which the anode electrode has a structure in which presence or absence of a reflection effect due to presence or absence of a metal material on the electrode surface on the non-light emitting unit side can be selected.

[A-8] The display device according to [A-2] described above, in which the anode electrode is formed directly on the stepped shape of the base insulating layer, and the electrode surface has a stepped shape.

[A-9] The display device according to [A-2] described above, in which the anode electrode has an electrode surface shape having a reflector effect.

[A-10] The display device according to [A-1] described above, in which one pixel that is a unit for forming a color image includes subpixels of a plurality of colors, and, in a case of having a cavity structure that utilizes a resonance effect of light between a cathode electrode and the anode electrode of the light emitting unit, a step is provided for each of the subpixels of a plurality of colors on the formation surface of the anode electrode of the base insulating layer.

[A-11] The display device according to [A-10] described above, in which the subpixels of the plurality of colors include subpixels of three primary colors of red, green and blue, and formation surfaces of the anode electrodes of the other subpixels are determined on the basis of a formation surface of the anode electrode of the subpixel of red.

[A-12] The display device according to [A-2] described above, in which each step of the stepped shape of the base insulating layer is subjected to processing of making a side surface have a tapered shape.

[A-13] The display device according to the [A-2] described above, in which each step of the stepped shape of the base insulating layer is subjected to processing of cutting a corner.

[A-14] The display device according to any one of [A-1] to [A-13] described above, in which the light emitting unit includes an organic EL element.

<<B. Manufacturing Method of Display Device>>

[B-1] A manufacturing method of a display device including in manufacturing the display device having a pixel region in which a pixel including a light emitting unit is arranged on a substrate, providing, in the pixel region, a region in which an anode electrode of the light emitting unit includes a pixel inclined with respect to a substrate surface, and forming an electrode surface of the anode electrode at an inclination angle according to a surface shape of a base insulating layer.

[B-2] The manufacturing method of the display device according to [B-1] described above, in which the surface shape of the base insulating layer is a stepped shape, and the anode electrode is formed on the stepped shape of the base insulating layer.

[B-3] The manufacturing method of the display device according to [B-2] described above, in which the inclination angle of the electrode surface of the anode electrode is determined by a depth of a step, a number of steps, and a step width of the stepped shape of the base insulating layer.

[B-4] The manufacturing method of the display device according to [B-2] described above, in which the stepped shape of the base insulating layer is embedded with a metal material and is smoothed, and the anode electrode is formed on a smoothed portion of the base insulating layer.

[B-5] The manufacturing method of the display device according to [B-4] described above, in which the inclination angle of the electrode surface of the anode electrode is symmetrical in a first direction and a second direction with respect to an electrode center in plan view.

[B-6] The manufacturing method of the display device according to [B-4] described above, in which the inclination angle of the electrode surface of the anode electrode is asymmetrical in a first direction with respect to an electrode center in plan view, and one side of the electrode surface of an asymmetrical shape is a non-light emitting unit side.

[B-7] The manufacturing method of the display device according to [B-6] described above, in which the anode electrode has a structure in which presence or absence of a reflection effect due to presence or absence of a metal material on the electrode surface on the non-light emitting unit side can be selected.

[B-8] The manufacturing method of the display device according to [B-2] described above, in which the anode electrode is formed directly on the stepped shape of the base insulating layer, and the electrode surface has a stepped shape.

[B-9] The manufacturing method of the display device according to [B-2] described above, in which the anode electrode has an electrode surface shape having a reflector effect.

[B-10] The manufacturing method of the display device according to [B-1] described above, in which one pixel that is a unit for forming a color image includes subpixels of a plurality of colors, and, in a case of having a cavity structure that utilizes a resonance effect of light between a cathode electrode and the anode electrode of the light emitting unit, a step is provided for each of the subpixels of a plurality of colors on the formation surface of the anode electrode of the base insulating layer.

[B-11] The manufacturing method of the display device according to [B-10] described above, in which the subpixels of the plurality of colors include subpixels of three primary colors of red, green and blue, and formation surfaces of the anode electrodes of the other subpixels are determined on the basis of a formation surface of the anode electrode of the subpixel of red.

[B-12] The manufacturing method of the display device according to [B-2] described above, in which each step of the stepped shape of the base insulating layer is subjected to processing of making a side surface have a tapered shape.

[B-13] The manufacturing method of the display device according to the [B-2] described above, in which each step of the stepped shape of the base insulating layer is subjected to processing of cutting a corner.

[B-14] The manufacturing method of the display device according to any one of [B-1] to [B-13] described above,
in which the light emitting unit includes an organic EL element.

<<C. Electronic Device>>

[C-1] An electronic device including a display device including
a pixel region including a pixel including a light emitting unit arranged on a substrate,
in which, in the pixel region, an anode electrode of the light emitting unit is provided with a region including a pixel inclined with respect to a substrate surface, and
an electrode surface of the anode electrode has an inclination angle according to a surface shape of a base insulating layer.

[C-2] The electronic device according to [C-1] described above,
in which the surface shape of the base insulating layer is a stepped shape, and
the anode electrode is formed on the stepped shape of the base insulating layer.

[C-3] The electronic device according to [C-2] described above,
in which the inclination angle of the electrode surface of the anode electrode is determined by a depth of a step, a number of steps, and a step width of the stepped shape of the base insulating layer.

[C-4] The electronic device according to [C-2] described above,
in which the stepped shape of the base insulating layer is embedded with a metal material and is smoothed, and
the anode electrode is formed on a smoothed portion of the base insulating layer.

[C-5] The electronic device according to [C-4] described above,
in which the inclination angle of the electrode surface of the anode electrode is symmetrical in a first direction and a second direction with respect to an electrode center in plan view.

[C-6] The electronic device according to [C-4] described above,
in which the inclination angle of the electrode surface of the anode electrode is asymmetrical in a first direction with respect to an electrode center in plan view, and one side of the electrode surface of an asymmetrical shape is a non-light emitting unit side.

[C-7] The electronic device according to [C-6] described above,
in which the anode electrode has a structure in which presence or absence of a reflection effect due to presence or absence of a metal material on the electrode surface on the non-light emitting unit side can be selected.

[C-8] The electronic device according to [C-2] described above,
in which the anode electrode is formed directly on the stepped shape of the base insulating layer, and the electrode surface has a stepped shape.

[C-9] The electronic device according to [C-2] described above,
in which the anode electrode has an electrode surface shape having a reflector effect.

[C-10] The electronic device according to [C-1] described above,
in which one pixel that is a unit for forming a color image includes subpixels of a plurality of colors, and, in a case of having a cavity structure that utilizes a resonance effect of light between a cathode electrode and the anode electrode of the light emitting unit,
a step is provided for each of the subpixels of a plurality of colors on the formation surface of the anode electrode of the base insulating layer.

[C-11] The electronic device according to [C-10] described above,
in which the subpixels of the plurality of colors include subpixels of three primary colors of red, green and blue, and
formation surfaces of the anode electrodes of the other subpixels are determined on the basis of a formation surface of the anode electrode of the subpixel of red.

[C-12] The electronic device according to [C-2] described above,
in which each step of the stepped shape of the base insulating layer is subjected to processing of making a side surface have a tapered shape.

[C-13] The electronic device according to the [C-2] described above,
in which each step of the stepped shape of the base insulating layer is subjected to processing of cutting a corner.

[C-14] The electronic device according to any one of [C-1] to [C-13] described above,
in which the light emitting unit includes an organic EL element.

REFERENCE SIGNS LIST

10 Organic EL display device
20 Pixel (pixel circuit)
21 Organic EL element
22 Driving transistor
23 Sampling transistor
24 Light emission control transistor
25 Holding capacitor
26 Auxiliary capacitor
30 Pixel array unit
40 Writing scanning unit
50 Driving scanning unit
60 Signal output unit
70 Display panel
80 Lens (lens group)
101 Substrate
102 Circuit layer
103 Inorganic insulating layer
104 Base insulating layer
105 Anode electrode
106 Organic insulating layer
107 Organic EL layer
108 Cathode electrode

The invention claimed is:
1. A display device comprising
a pixel region including a pixel including a light emitting unit arranged on a substrate,
wherein
the pixel region is provided with a region in which an anode electrode of the light emitting unit is inclined with respect to a substrate surface, and
an electrode surface of the anode electrode has a first inclination angle according to a surface shape of a base insulating layer, and
a portion of the surface shape has a second inclination angle that is different from the first inclination angle,
wherein the surface shape of the base insulating layer is a stepped shape, and wherein the anode electrode is formed on the stepped shape of the base insulating layer.

2. The display device according to claim 1, wherein
the first inclination angle of the electrode surface of the anode electrode is determined by a depth of a step,
a number of steps, and
a step width of the stepped shape of the base insulating layer.

3. The display device according to claim 1, wherein
the stepped shape of the base insulating layer is embedded with a metal material and is smoothed, and
the anode electrode is formed on a smoothed portion of a combination of the base insulating layer and the metal material.

4. The display device according to claim 3, wherein
the first inclination angle of the electrode surface of the anode electrode is symmetrical in a first direction and a second direction with respect to an electrode center in plan view.

5. The display device according to claim 3, wherein
the electrode surface of the anode electrode is asymmetrical in a first direction with respect to an electrode center in plan view, and one side of the electrode surface of an asymmetrical shape is a non-light emitting unit side.

6. The display device according to claim 5, wherein
the anode electrode has a structure that has a reflection effect due to presence of the metal material on the electrode surface on the non-light emitting unit side.

7. The display device according to claim 1, wherein
the electrode surface has a second stepped shape that is different from the stepped shape.

8. The display device according to claim 1, wherein
the anode electrode has an electrode surface shape having a reflector effect.

9. The display device according to claim 1, wherein
one pixel that is a unit for forming a color image includes subpixels of a plurality of colors, the one pixel has a cavity structure that utilizes a resonance effect of light between a cathode electrode and the anode electrode of the light emitting unit, and
a step is provided for each of the subpixels of the plurality of colors on a formation surface of the anode electrode.

10. The display device according to claim 9, wherein
the subpixels of the plurality of colors include subpixels of three primary colors of red, green, and blue, and
formation surfaces of other anode electrodes of other subpixels are based on a formation surface of a second anode electrode of a red subpixel.

11. The display device according to claim 1, wherein
each step of the stepped shape of the base insulating layer has a side surface with a tapered shape.

12. The display device according to claim 1, wherein
each step of the stepped shape of the base insulating layer has a cut corner.

13. The display device according to claim 1, wherein
the light emitting unit includes an organic EL element.

14. A manufacturing method of a display device comprising:
forming, in a pixel region, a region in which an anode electrode of a light emitting unit is inclined with respect to a substrate surface of a substrate, wherein a pixel in the pixel region includes the light emitting unit arranged on the substrate; and
forming an electrode surface of the anode electrode at a first inclination angle according to a surface shape of a base insulating layer,
wherein a portion of the surface shape has a second inclination angle that is different from the first inclination angle,
wherein the surface shape of the base insulating layer is a stepped shape, and
wherein the anode electrode is formed on the stepped shape of the base insulating layer.

15. An electronic device comprising:
a display device including a pixel region including
a pixel including a light emitting unit arranged on a substrate, wherein,
in the pixel region, an anode electrode of the light emitting unit is provided inclined with respect to a substrate surface, and
an electrode surface of the anode electrode has a first inclination angle according to a surface shape of a base insulating layer,
wherein a portion of the surface shape has a second inclination angle that is different from the first inclination angle,
wherein the surface shape of the base insulating layer is a stepped shape, and
wherein the anode electrode is formed on the stepped shape of the base insulating layer.

16. The electronic device according to claim 15, wherein
the first inclination angle of the electrode surface of the anode electrode is determined by a depth of a step,
a number of steps, and
a step width of the stepped shape of the base insulating layer.

17. The electronic device according to claim 15, wherein
the stepped shape of the base insulating layer is embedded with a metal material and is smoothed, and
the anode electrode is formed on a smoothed portion of the base insulating layer and the metal material.

18. The electronic device according to claim 17, wherein
the first inclination angle of the electrode surface of the anode electrode is symmetrical in a first direction and a second direction with respect to an electrode center in plan view.

* * * * *